US009515673B2

(12) United States Patent
Isozaki

(10) Patent No.: US 9,515,673 B2
(45) Date of Patent: Dec. 6, 2016

(54) D/A CONVERSION CIRCUIT, OSCILLATOR, ELECTRONIC APPARATUS, AND MOVING OBJECT

(71) Applicant: Seiko Epson Corporation, Tokyo (JP)

(72) Inventor: Shigenori Isozaki, Tatsuno (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/995,473

(22) Filed: Jan. 14, 2016

(65) Prior Publication Data

US 2016/0211860 A1 Jul. 21, 2016

(30) Foreign Application Priority Data

Jan. 19, 2015 (JP) ................................. 2015-007932
Jan. 19, 2015 (JP) ................................. 2015-007935

(51) Int. Cl.
| | | |
|---|---|---|
| *H03M 1/66* | (2006.01) | |
| *H01L 27/06* | (2006.01) | |
| *H01L 49/02* | (2006.01) | |
| *H01L 27/02* | (2006.01) | |
| *H01L 29/49* | (2006.01) | |
| *H01L 27/092* | (2006.01) | |
| *H03B 5/02* | (2006.01) | |

(52) U.S. Cl.
CPC ............ *H03M 1/66* (2013.01); *H01L 27/0207* (2013.01); *H01L 27/0629* (2013.01); *H01L 27/092* (2013.01); *H01L 28/20* (2013.01); *H01L 29/4916* (2013.01); *H03B 5/02* (2013.01)

(58) Field of Classification Search
CPC ........ H03M 1/765; H03M 1/808; H03M 1/76; H03M 1/682; H03M 1/0602; H03M 1/0692; H03M 1/1061; H03M 1/785; H03M 1/687

USPC .................................................. 341/144, 148
See application file for complete search history.

(56) References Cited

U.S. PATENT DOCUMENTS

| | | | | |
|---|---|---|---|---|
| 5,877,985 A | * | 3/1999 | Banba ................... | G11O 5/147 365/185.18 |
| 6,344,815 B2 | | 2/2002 | Ureshino | |
| 6,551,913 B1 | * | 4/2003 | Kim ...................... | H01L 29/665 257/E21.438 |
| 6,828,861 B2 | * | 12/2004 | Cho ........................ | H03F 3/211 330/124 R |
| 2001/0052867 A1 | | 12/2001 | Ureshino | |

(Continued)

FOREIGN PATENT DOCUMENTS

JP 2001-111428 A 4/2001

*Primary Examiner* — Lam T Mai
(74) *Attorney, Agent, or Firm* — Harness, Dickey & Pierce, P.L.C.

(57) ABSTRACT

A D/A conversion circuit includes a plurality of resistors that are connected to each other in series, and a plurality of MOS transistors that are connected to terminals of the plurality of resistors, respectively. The plurality of resistors and the plurality of MOS transistors are formed on a semiconductor substrate. Each of the plurality of resistors is constituted by a resistive element and a plurality of contacts provided in the resistive element. The plurality of MOS transistors are disposed so that a plurality of virtual straight lines that pass through each of the plurality of contacts and are perpendicular to a longitudinal direction of the resistive element pass between gate electrodes of two adjacent MOS transistors, when seen in a plan view of the semiconductor substrate.

19 Claims, 13 Drawing Sheets

(56) References Cited

U.S. PATENT DOCUMENTS

| | | | |
|---|---|---|---|
| 2007/0052569 A1* | 3/2007 | Saito | H03M 1/0602 341/154 |
| 2010/0044834 A1* | 2/2010 | Park | H01L 27/0259 257/572 |
| 2012/0104391 A1* | 5/2012 | Wu | G09G 3/3677 257/59 |
| 2013/0269443 A1* | 10/2013 | Larosa | G01L 9/0054 73/754 |

* cited by examiner

| DIGITAL CODE BITS 10 TO 8 | 111 | 110 | 101 | 100 | 011 | 010 | 001 | 000 |
|---|---|---|---|---|---|---|---|---|
| P(8m−1), N(8m−1) | ON | ON | OFF | OFF | OFF | OFF | OFF | OFF |
| P(8m−3), N(8m−3) | OFF | OFF | ON | ON | OFF | OFF | OFF | OFF |
| P(8m−5), N(8m−5) | OFF | OFF | OFF | OFF | ON | ON | OFF | OFF |
| P(8m−7), N(8m−7) | OFF | OFF | OFF | OFF | OFF | OFF | ON | ON |

FIG. 2A

| DIGITAL CODE BITS 10 TO 8 | 111 | 110 | 101 | 100 | 011 | 010 | 001 | 000 |
|---|---|---|---|---|---|---|---|---|
| P(8m−2), N(8m−2) | OFF | ON | ON | OFF | OFF | OFF | OFF | OFF |
| P(8m−4), N(8m−4) | OFF | OFF | OFF | ON | ON | OFF | OFF | OFF |
| P(8m−6), N(8m−6) | OFF | OFF | OFF | OFF | OFF | ON | ON | OFF |
| P(8m−8), N(8m−8) | ON | OFF | OFF | OFF | OFF | OFF | OFF | ON |

FIG. 2B

D/A CONVERSION CIRCUIT, OSCILLATOR, ELECTRONIC APPARATUS, AND MOVING OBJECT

BACKGROUND

1. Technical Field

The present invention relates to a D/A conversion circuit, an oscillator, an electronic apparatus, and a moving object.

2. Related Art

JP-A-2001-111428 discloses a digital to analog (DAC) converter in which a switch for selecting a voltage dividing resistor of a D/A converter, which has been hitherto constituted by an N-channel type MOS transistor and a P-channel type MOS transistor, is constituted by only an N-channel type MOS transistor. According to such a D/A converter, since a P-channel type MOS transistor formed in an N-well is not used, a voltage dividing resistor may not be disposed in the vicinity of the N-well, and thus it is possible to solve a problem of the related art that a distortion rate deteriorates at the time of performing analog conversion due to a refractive index of light being influenced by a slight level difference between the height of the N-well region and the height of a P-type substrate except for the region and the finish widths of polysilicon, constituting a resistor, being different from each other in the vicinity of the N-well and other locations.

Incidentally, when an increase in bits of a D/A converter is advanced in order to improve a resolving power of the converter, the area of a resistive element constituting a voltage dividing resistor hardly changes, but the number of MOS transistors functioning as switches is increased, and thus the whole area is considerably increased. On the other hand, in the layout design of the D/A converter, when there is an attempt to make an area small by disposing the MOS transistor in proximity to the resistive element, it is not possible to sufficiently secure a distance between the resistive element and a gate electrode of the MOS transistor. Then, in a process of manufacturing a semiconductor integrated circuit, a resistive element is generally manufactured after a process of creating a gate electrode. For this reason, when the resistive element and the gate electrode are disposed so as to be excessively close to each other, a level difference is generated in the base of the resistive element due to the gate electrode. Accordingly, a level difference is also generated in a resist in the subsequent photolithography process, and defocusing occurs by exposure at an end in a region in which the resistive element is manufactured, due to a difference between the height of the resist and the original height of the resist, which results in an increase in an exposed region (FIG. 17A)). Then, in the subsequent etching process, the resist in a region in which the resistive element is originally desired to be manufactured is excessively removed, and the size of the resistive element is determined along the edge of the resist, and thus the width of the resistive element becomes smaller than its original width (FIG. 17B)).

Accordingly, a portion of the resistive element which is close to the gate electrode of the MOS transistor becomes thinner, but a portion thereof which is not close to the gate electrode of the MOS transistor does not become thinner, which results in a difference in a resistance value of a voltage dividing resistor constituting the resistive element, and thus there is a problem in that it is not possible to realize a highly accurate D/A converter.

SUMMARY

An advantage of some aspects of the invention is to provide a D/A conversion circuit which is highly accurate and is capable of being miniaturized, an oscillator, an electronic apparatus, and a moving object which use the D/A conversion circuit.

The invention can be implemented as the following forms or application examples.

APPLICATION EXAMPLE 1

A D/A conversion circuit according to this application example includes a plurality of resistors that are connected to each other in series; and a plurality of MOS transistors that are connected to terminals of the plurality of resistors, respectively. The plurality of resistors and the plurality of MOS transistors are formed on a semiconductor substrate. The plurality of resistors are constituted by a resistive element and a plurality of contacts provided in the resistive element. The plurality of MOS transistors are disposed so that a plurality of virtual straight lines that pass through each of the plurality of contacts and are perpendicular to a longitudinal direction of the resistive element pass between gate electrodes of two adjacent MOS transistors, when seen in a plan view of the semiconductor substrate.

According to the D/A conversion circuit according to this application example, the MOS transistors are disposed so that the respective gate electrodes of the plurality of MOS transistors face portions equivalent to the respective resistors formed in the resistive element, and thus there is a small difference in the influence on a resistance value of each resistor by the arrangement of the gate electrodes of the respective MOS transistors. In this case, voltage dividing ratios of the plurality of resistors become close to a constant value, and thus it is possible to improve the accuracy of an output voltage generated on the basis of voltage division.

According to the D/A conversion circuit according to this application example, for example, when each resistor and each gate electrode are disposed so as to have a constant distance therebetween, there is a small difference in the influence on a resistance value of each resistor by the arrangement of the gate electrode even when the distance is reduced, and thus a reduction in size can be achieved.

APPLICATION EXAMPLE 2

In the D/A conversion circuit according to the application example, each of the plurality of resistors may have a recess formed on a side facing the MOS transistor.

According to the D/A conversion circuit according to this application example, each of the plurality of resistors is disposed to be closer to the MOS transistor as the resistor has more recesses, that is, as the degree of contravention of a design rule becomes higher, and thus a reduction in size can be achieved.

APPLICATION EXAMPLE 3

In the D/A conversion circuit according to the application example, each of the plurality of resistors may have the recess formed along the gate electrode of the MOS transistor opposite thereto, when seen in a plan view of the semiconductor substrate.

According to the D/A conversion circuit according to this application example, when the plurality of resistors and the gate electrodes of the plurality of MOS transistors are formed in the same layer, it is possible to realize the D/A conversion circuit which is highly accurate and is capable of being miniaturized.

APPLICATION EXAMPLE 4

In the D/A conversion circuit according to the application example, the gate electrode of the MOS transistor may be formed of polysilicon.

According to the D/A conversion circuit according to this application example, when the plurality of resistors are formed in the same layer as the polysilicon, it is possible to realize the D/A conversion circuit which is highly accurate and is capable of being miniaturized.

APPLICATION EXAMPLE 5

In the D/A conversion circuit according to the application example, a distance between each of the plurality of resistors and the gate electrode of the MOS transistor may be equal to or less than 1 µm.

APPLICATION EXAMPLE 6

In the D/A conversion circuit according to the application example, the plurality of MOS transistors may be constituted by a plurality of P-channel type MOS transistors and a plurality of N-channel type MOS transistors. When seen in a plan view of the semiconductor substrate, each of the plurality of P-channel type MOS transistors may be disposed so as to face one end parallel to the longitudinal direction of the resistive element, and each of the plurality of N-channel type MOS transistors may be disposed so as to face the other end parallel to the longitudinal direction of the resistive element.

According to the D/A conversion circuit according to this application example, for example, when a complementary analog switch constituted by a pair of a P-channel type MOS transistor and an N-channel type MOS transistor is connected to a terminal of each resistor as a switch, it is possible to reduce the layout area.

APPLICATION EXAMPLE 7

In the D/A conversion circuit according to the application example, when seen in a plan view of the semiconductor substrate, the resistor that faces the MOS transistor may have a recess formed on a side facing the MOS transistor, and the resistor that does not face the MOS transistor may face a dummy electrode different from electrodes of the plurality of MOS transistors and may have a recess formed on a side facing the dummy electrode.

According to the D/A conversion circuit according to this application example, a resistor that faces the MOS transistor, in the plurality of resistors connected to each other in series, has a recess formed on a side facing the MOS transistor. On the other hand, a resistor that does not face the MOS transistor also has a recess formed on a side facing the dummy electrode, and thus a difference between resistance values of the plurality of resistors is smaller than that in the related art. That is, in this case, since the dummy electrode is disposed, voltage dividing ratios of the plurality of resistors become close to a constant value, and thus it is possible to improve the accuracy of an output voltage generated on the basis of voltage division.

According to the D/A conversion circuit according to this application example, each of the plurality of resistors is disposed to be closer to the MOS transistor or the dummy electrode as the resistor has more recesses, that is, as the degree of contravention of a design rule becomes higher, and thus a reduction in size can be achieved.

APPLICATION EXAMPLE 8

An oscillator according to this application example includes the D/A conversion circuit according to any one of the above-described application examples.

According to the oscillator circuit according to this application example, the D/A conversion circuit which is highly accurate and has a small size is used, and thus it is possible to realize the oscillator having a high accuracy of oscillating frequency and having a small size.

APPLICATION EXAMPLE 9

An electronic apparatus according to this application example includes the D/A conversion circuit according to any one of the above-described application examples.

APPLICATION EXAMPLE 10

A moving object according to this application example includes the D/A conversion circuit according to any one of the above-described application examples.

According to these application examples, the D/A conversion circuit which is highly accurate and has a small size is used, and thus it is possible to realize, for example, a highly-reliable electronic apparatus and moving object.

BRIEF DESCRIPTION OF THE DRAWINGS

The invention will be described with reference to the accompanying drawings, wherein like numbers reference like elements.

FIGS. 2A and 2B are truth tables showing a control logic of turn-on and turn-off of a MOS transistor.

DESCRIPTION OF EXEMPLARY EMBODIMENTS

Hereinafter, preferred embodiments of the invention will be described in detail with reference the accompanying drawings. Meanwhile, the embodiments described below are not unduly limited to the disclosure of the invention described in the appended claims. In addition, all the configurations described below are not necessarily essential components of the invention.

1. D/A Conversion Circuit
1-1. First Embodiment

Figure 1:
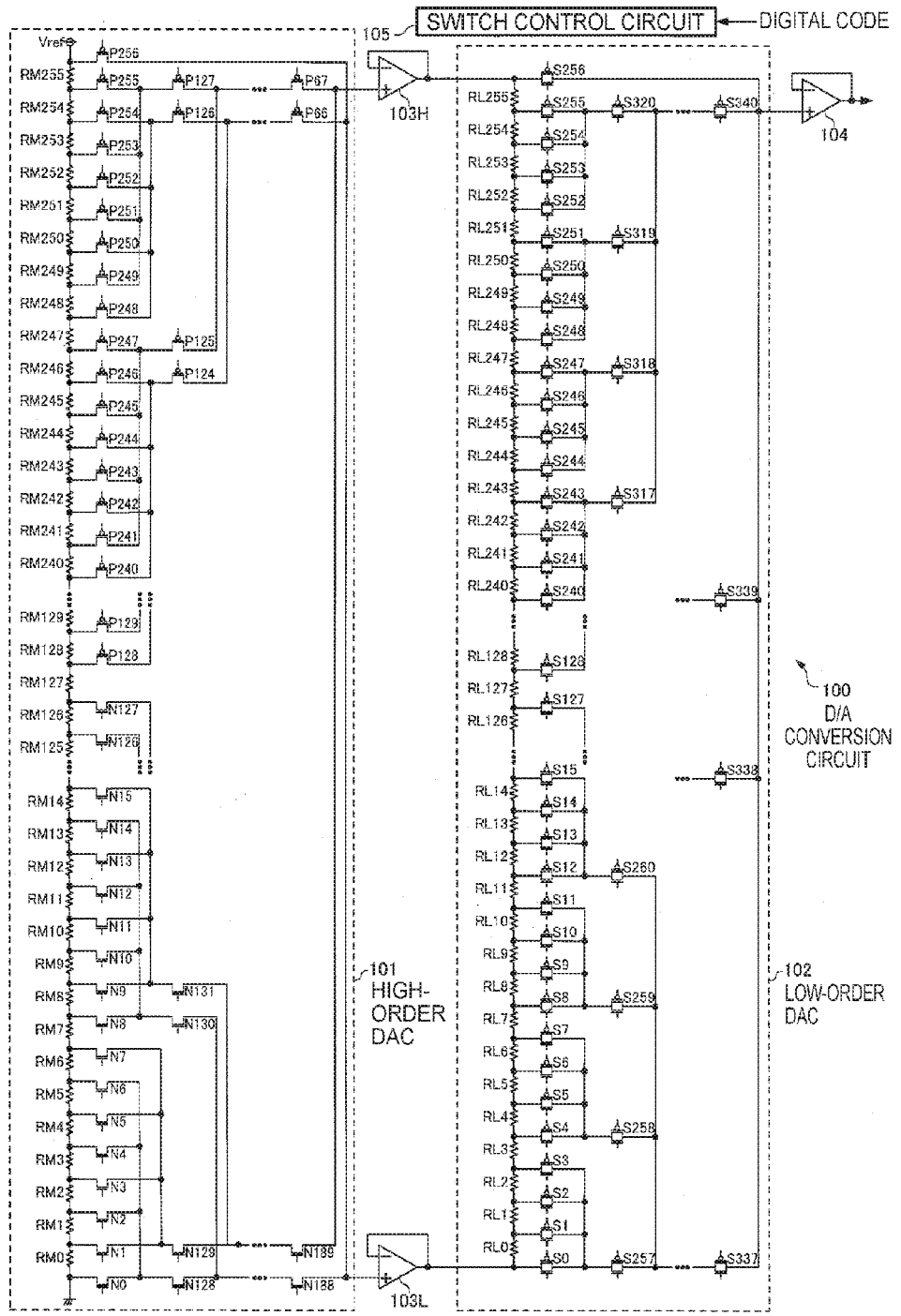
FIG. 1 is a diagram illustrating a configuration of a D/A conversion circuit according to a first embodiment.

FIG. 1 is a diagram illustrating a configuration of a D/A conversion circuit according to a first embodiment. A D/A conversion circuit 100 of the first embodiment is configured to include a high-order DAC 101, a low-order DAC 102, an operational amplifiers 103H, 103L, and 104, and a switch control circuit 105. The D/A conversion circuit 100 of the first embodiment is a resistance voltage division type (also referred to as a voltage distribution type, a resistance string type, or a voltage potential type) D/A conversion circuit, and outputs 65536 types of voltages depending on input values of 16-bit digital codes.

The high-order DAC 101 is configured to include 256 resistors RM0 to RM255, 191 P-channel type MOS transistors P66 to P256, and 190 N-channel type MOS transistors N0 to N189 which are formed on a semiconductor substrate.

The 256 resistors RM0 to RM255 are connected to each other in series between a ground and a supply line of a reference voltage Vref.

In the resistor RM127, a terminal on a high potential side is connected to a source of the P-channel type MOS transistor P128, and a terminal on a low potential side is connected to a drain of the N-channel type MOS transistor N127.

In each of the resistors RM(n) (n=128 to 255) on the higher potential side than the resistor RM127, one end (terminal on the low potential side) thereof is connected to a source of each of the P-channel type MOS transistors P (n), different from each other, which are located at a first stage, and the other end (terminal on the high potential side) thereof is connected to a source of each of the P-channel type MOS transistors P (n+1), different from each other, which are located at the first stage.

In each of the resistors RM(n) (n=1 to 126) on the lower potential side than the resistor RM127, one end (terminal on the low potential side) thereof is connected to a drain of each of the N-channel type MOS transistors N(n), different from each other, which are located at the first stage, and the other end (terminal on the high potential side) thereof is connected to a drain of each of the N-channel type MOS transistors N(n+1), different from each other, which are located at the first stage.

Here, 128 P-channel type MOS transistors P128 to P255, except for the P-channel type MOS transistor P256, which are located at the first stage have drains connected to each other for every four transistors on every other transistor from the high potential side, and are connected to the respective sources of 32 P-channel type MOS transistors P96 (not shown) to P127 located at a second stage. For example, the drains of four P-channel type MOS transistors P255, P253, P251, and P249 located at the first stage are connected to the source of the P-channel type MOS transistor P127 located at the second stage. In addition, the drains of four P-channel type MOS transistors P254, P252, P250, and P248 located at the first stage are connected to the source of the P-channel type MOS transistor P126 located at the second stage. In addition, the drains of four P-channel type MOS transistors P247, P245, P243, and P241 located at the first stage are connected to the source of the P-channel type MOS transistor P125 located at the second stage. In addition, the drains of four P-channel type MOS transistors P246, P244, P242, and P240 located at the first stage are connected to the source of the P-channel type MOS transistor P124 located at the second stage.

Here, 32 P-channel type MOS transistors P96 to P127 located at the second stage have drains connected to each other for every two transistors on every other transistor from the high potential side, and are connected to the respective sources of 16 P-channel type MOS transistors P80 to P95 (all of which are not shown in the drawing) which are located at a third stage. For example, the drains of two P-channel type MOS transistors P127 and P125 located at the second stage are connected to the source of the P-channel type MOS transistor P95 (not shown) which is located at the third stage. In addition, the drains of two P-channel type MOS transistors P126 and P124 located at the second stage are connected to the source of the P-channel type MOS transistor P94 (not shown) which is located at the third stage.

Hereinafter, similarly, 16 P-channel type MOS transistors P80 to P95 located at the third stage have drains connected to each other for every two transistors on every other transistor from the high potential side, and are connected to the respective sources of eight P-channel type MOS transistors P72 to P79 (all of which are not shown in the drawing) which are located at a fourth stage. In addition, eight P-channel type MOS transistors P72 to P79 located at the fourth stage have drains connected to each other for every two transistors on every other transistor from the high potential side, and are connected to the respective sources of four P-channel type MOS transistors P68 to P71 (all of which are not shown in the drawing) which are located at a fifth stage. In addition, four P-channel type MOS transistors P68 to P71 located at the fifth stage have drains connected to each other for every two transistors on every other transistor from the high potential side, and are connected to the respective sources of two P-channel type MOS transistors P66 and P67 located at a sixth stage.

Here, 128 N-channel type MOS transistors N0 to N127 located at the first stage have sources connected to each other for every four transistors on every other transistor from the low potential side, and are connected to the respective drains of 32 N-channel type MOS transistors N128 to N159 (not shown) which are located at the second stage. For example, the sources of four N-channel type MOS transistors N0, N2, N4, and N6 located at the first stage are connected to the drain of the N-channel type MOS transistor N128 located at the second stage. In addition, the sources of four N-channel type MOS transistors N1, N3, N5, and N7 located at the first stage are connected to the drain of the N-channel type MOS transistor N129 located at the second stage. In addition, the sources of four N-channel type MOS transistors N8, N10, N12, and N14 located at the first stage are connected to the drain of the N-channel type MOS transistor N130 located at the second stage. In addition, the sources of four N-channel type MOS transistor N9, N11, N13, and N15 located at the first stage are connected to the drain of the N-channel type MOS transistor N131 located at the second stage.

Here, 32 N-channel type MOS transistors N128 to N159 located at the second stage have sources connected to each other for every two transistors on every other transistor from the low potential side, and are connected to the respective drains of 16 N-channel type MOS transistors N160 to N175 (all of which are not shown in the drawing) which are located at the third stage. For example, the sources of two N-channel type MOS transistors N128 and N130 located at the second stage are connected to the drain of the N-channel type MOS transistor N160 (not shown) which is located at the third stage. In addition, the sources of two N-channel type MOS transistors N129 and N131 located at the second stage are connected to the source of the N-channel type MOS transistor N161 (not shown) which is located at the third stage.

Hereinafter, similarly, 16 N-channel type MOS transistors N160 to N175 located at the third stage have sources connected to each other for every two transistors on every other transistor from the low potential side, and are connected to the respective drains of eight N-channel type MOS transistors N176 to N183 (all of which are not shown in the drawing) which are located at the fourth stage. In addition, eight N-channel type MOS transistors N176 to N183 located at the fourth stage have sources connected to each other for every two transistors on every other transistor from the low potential side, and are connected to the respective drains of four N-channel type MOS transistors N184 to N187 (all of which are not shown in the drawing) which are located at the fifth stage. In addition, four N-channel type MOS transistors N184 to N187 located at the fifth stage have sources connected to each other for every two transistors for every other transistor from the low potential side, and are connected to the respective drains of two N-channel type MOS transistors N188 and N189 located at the sixth stage.

The drain of the P-channel type MOS transistor P67 located at the sixth stage is connected to the source of the N-channel type MOS transistor N189, and is connected to a non-inverting input terminal (positive terminal) of the operational amplifier 103H. In addition, the drain of the P-channel type MOS transistor P256 located at the first stage and the drain of the P-channel type MOS transistor P66 located at the sixth stage are connected to the source of the N-channel type MOS transistor N188, and are connected to a non-inverting input terminal (positive terminal) of the operational amplifier 103L.

Each of both the operational amplifiers 103H and 103L has an output terminal and an inverting input terminal (negative terminal) connected to each other, and functions as a voltage follower that propagates a voltage of a non-inverting input terminal (positive terminal) to the output terminal.

The switch control circuit 105 has 16-bit digital codes input thereto, and controls the turn-on and turn-off of 191 P-channel type MOS transistors P66 to P255 and 190 N-channel type MOS transistors N0 to N189 which are included in the high-order DAC 101 in accordance with the values of high-order 8 bits (bits 15 to 8) in the 16-bit digital codes (bits 15 to 0).

Only one of four P-channel type MOS transistors P($8m$-1), P($8m$-3), P($8m$-5), and P($8m$-7) (m=17 to 32), except for the P-channel type MOS transistor P256, which are located at the first stage is turned on. For example, only one of four P-channel type MOS transistors P255, P253, P251, and P249 is set to be in an on state, and the other three transistors are set to be in an off state. In addition, only of one four P-channel type MOS transistors P247, P245, P242, and P241 is set to be in an on state, and the other three transistors are set to be in an off state.

Similarly, only one of four P-channel type MOS transistors P($8m$-2), P($8m$-4), P($8m$-6), and P($8m$-8) (m=17 to 32) which are located at the first stage is turned on. For example, only one of four P-channel type MOS transistors P254, P252, P250, and P248 is set to be in an on state, and the other three transistors are set to be in an off state. In addition, only one of four P-channel type MOS transistors P246, P244, P242, and P240 is set to be in an on state, and the other three transistors are set to be in an off state.

In addition, only one of four N-channel type MOS transistors N($8m$-1), N($8m$-3), N($8m$-5), and N($8m$-7) (m=1 to 16) which are located at the first stage is turned on. For example, only one of four N-channel type MOS transistors N7, N5, N3, and N1 is set to be in an on state, and the other three transistors are set to be in an off state. In addition, only one of four N-channel type MOS transistors N15, N13, N11, and N9 is set to be in an on state, and the other three transistors are set to be in an off state.

Similarly, only one of four N-channel type MOS transistors N($8m$-2), N($8m$-4), N($8m$-6), and N($8m$-8) (m=1 to 16) which are located at the first stage is turned on. For example, only one of four N-channel type MOS transistors N6, N4, N2, and N0 is set to be in an on state, and the other three transistors are set to be in an off state. In addition, only one of four N-channel type MOS transistors N14, N12, N10, and N8 is set to be in an on state, and the other three transistors are set to be in an off state.

Here, 16 sets of four P-channel type MOS transistors P($8m$-1), P($8m$-3), P($8m$-5), and P($8m$-7) (m=17 to 32) and 16 sets of four N-channel type MOS transistors N($8m$-1), N($8m$-3), N($8m$-5), and N($8m$-7) (m=1 to 16) are all turned on and turned off by the same control logic. For example, two P-channel type MOS transistors P255 and P247 and two N-channel type MOS transistors N15 and N7 are simultaneously set to be in an on state or an off state.

Similarly, 16 sets of four P-channel type MOS transistors P($8m$-2), P($8m$-4), P($8m$-6), and P($8m$-8) (m=17 to 32) and 16 sets of four N-channel type MOS transistors N ($8m$-2), N($8m$-4), N($8m$-6), and N($8m$-8) (m=1 to 16) are all turned on and turned off by the same control logic. For example, two P-channel type MOS transistors P254 and P246 and two N-channel type MOS transistors N14 and N6 are simultaneously set to be in an on state or an off state.

The switch control circuit 105 controls the turn-on and turn-off of 128 P-channel type MOS transistors P128 to P255 and 128 N-channel type MOS transistors N0 to N127 which are located at the first stage in accordance with 3-bit values of bits 10 to 8 in the digital codes. FIG. 2A is a truth table showing a control logic of the turn-on and turn-off of four P-channel type MOS transistors P($8m$-1), P($8m$-3), P($8m$-5), and P($8m$-7) (m=17 to 32) or four N-channel type MOS transistors N($8m$-1), N($8m$-3), N($8m$-5), and N($8m$-7) (m=1 to 16). In addition, FIG. 2B is a truth table showing a control logic of the turn-on and turn-off of four P-channel type MOS transistors P($8m$-2), P($8m$-4), P($8m$-6), P($8m$-8) (m=17 to 32) or four N-channel type MOS transistors N($8m$-2), N($8m$-4), N($8m$-6), and N($8m$-8) (m=1 to 16). According to the control logics shown in FIGS. 2A and 2B, two adjacent P-channel type MOS transistors are simultaneously set to be in an on state, and two adjacent N-channel type MOS transistors are simultaneously set to be in an on state. For example, when bits 10 to 8 in the digital codes are "111", two adjacent P-channel type MOS transistors P255 and P254 are simultaneously set to be in an on state, and two adjacent P-channel type MOS transistors P247 and P246 are also simultaneously set to be in an on state. Further, two adjacent N-channel type MOS transistors N15 and N14 are also simultaneously set to be in an on state, and two adjacent N-channel type MOS transistors N7 and N6 are also simultaneously set to be in an on state.

Potentials of terminals of two resistors disposed on the low potential side at intervals of 8 resistors out of 128 resistors RM128 to RM255 through 16 sets of two adjacent P-channel type MOS transistors, which are set to be in an on state, are supplied to each of 32 P-channel type MOS transistors P96 to P127 located at the second stage. Similarly, potentials of terminals of two resistors disposed on the low potential side at intervals of 8 resistors out of 128 resistors RM0 to RM127 through 16 sets of two adjacent N-channel type MOS transistors, which are set to be in an on state, are supplied to each of 32 N-channel type MOS transistors N128 to N159 located at the second stage.

The switch control circuit 105 controls the turn-on and turn-off of 32 P-channel type MOS transistors P96 to P127 and 32 N-channel type MOS transistors N128 to N159 which are located at the second stage in accordance with a one-bit value of bit 11 in the digital code. Specifically, when bit 11 is 1, the switch control circuit 105 sets a MOS transistor (having a large number) on the high potential side to be in an on state and sets a MOS transistor (having a small number) on the low potential side to be in an off state with respect to each of 16 sets of two P-channel type MOS transistors having drains connected to each other and 16 sets of two N-channel type MOS transistors having sources connected to each other. In addition, when bit 11 is 0, the switch control circuit 105 sets a MOS transistor (having a large number) on the high potential side to be in an off state and sets a MOS transistor (having a small number) on the low potential side to be in an on state with respect to each of 16 sets of two P-channel type MOS transistors having drains connected to each other and 16 sets of two N-channel type MOS transistors having sources connected to each other.

The switch control circuit 105 controls the turn-on and turn-off of MOS transistors located at the third, fourth, and fifth stages in accordance with each 1-bit value of bits 12 to 14 in the digital codes, by the same logic as that used to control the turn-on and turn-off of the MOS transistors located at the second stage.

When 8 bits of bits 15 to 8 in the digital codes are all 1, the switch control circuit 105 sets the P-channel type MOS transistor P256 located at the first stage to be in an on state, and sets the P-channel type MOS transistor P66 and the N-channel type MOS transistor N188 which are located at the sixth stage to be in an off state. In addition, when at least one of 8 bits of bits 15 to 8 in the digital codes is 0, the switch control circuit 105 sets the P-channel type MOS transistor P256 to be in an off state. When bit 15 in the digital code is 1, the switch control circuit sets the P-channel type MOS transistor P66 to be in an on state and sets the N-channel type MOS transistor N188 to be in an off state. When bit 15 is 0, the switch control circuit sets the P-channel type MOS transistor P66 to be in an off state and sets the N-channel type MOS transistor N188 to be in an on state.

In addition, when bit 15 in the digital code is 1, the switch control circuit 105 sets the P-channel type MOS transistor P67 located at the sixth stage to be in an on state and sets the N-channel type MOS transistor N189 to be in an off state. When bit 15 is 0, the switch control circuit sets the P-channel type MOS transistor P67 to be in an off state and sets the N-channel type MOS transistor N189 to be in an on state.

The high-order DAC 101 configured in this manner selects and outputs any two voltages (voltages at both ends of any of the resistors RM0 to RM255) in 257 types of voltages obtained by dividing a reference voltage Vref by the resistors RM0 to RM255 in accordance with high-order 8 bits (bits 15 to 8) in the digital codes, and supplies two reference voltages to the low-order DAC 102 through two operational amplifiers 103H and 103L. Meanwhile, when bit 8 in the digital code 0, an output voltage of the operational amplifier 103H becomes higher than an output voltage of the operational amplifier 103L. When bit 8 in the digital code is 1, an output voltage of the operational amplifier 103L becomes higher than an output voltage of the operational amplifier 103H.

The low-order DAC 102 is configured to include 256 resistors RL0 to RL255, and 341 complementary analog switches (transfer gates) S0 to S340 each of which is constituted by a P-channel type MOS transistor and an N-channel type MOS transistor.

The 256 resistors RL0 to RL255 (examples of a plurality of resistors) are connected to each other in series between the output terminal of the operational amplifier 103L and the output terminal of the operational amplifier 103H.

In each resistor RL(k) (k=0 to 255), one end (terminal on the operational amplifier 103L side) thereof is connected to one end of each of the complementary analog switches S(k), different from each other, which are located at the first stage, and the other end (terminal on the operational amplifier 103H side) thereof is connected to one end of each of the complementary analog switches S(k+1), different from each other, which are located at the first stage.

Here, 256 complementary analog switches S0 to S255 (examples of a plurality of MOS transistors), except for the complementary analog switch S256, which are located at the first stage have other ends connected to each other for every four switches, and are connected to one end of each of 64 complementary analog switches S257 to S320 located at the second stage. For example, other ends of four complementary analog switches S255, S254, S253, and S252 located at the first stage are connected to one end of the complementary analog switch S320 located at the second stage.

Here, 64 complementary analog switches S257 to S320 located at the second stage have other ends connected to each other for every four switches, and are connected to one end of each of 16 complementary analog switches S321 to S336 (not shown) which are located at the third stage. For example, other ends of four complementary analog switches S320, S319, S318, and S317 located at the second stage are connected to one end of the complementary analog switch S336 (not shown) which is located at the third stage.

Hereinafter, similarly, 16 complementary analog switches S321 to S336 located at the third stage have other ends connected to each other for every four switches, and are connected to one end of each of four complementary analog switches S337 to S340 located at the fourth stage. In addition, the other end of the complementary analog switch S256 located at the first stage is connected to other ends of four complementary analog switches S337 to S340 located at the fourth stage, and is connected to a non-inverting input terminal (positive terminal) of the operational amplifier 104.

The operational amplifier 104 has an output terminal and an inverting input terminal (negative terminal) connected to each other, and functions as a voltage follower that propagates a voltage of a non-inverting input terminal (positive terminal) to the output terminal.

The switch control circuit 105 controls the turn-on and turn-off of 341 complementary analog switches S0 to S340 included in the low-order DAC 102 in accordance with the values of low-order 9 bits (bits 8 to 0) in the 16-bit digital codes (bits 15 to 0). Specifically, when bit 8 in the digital code is 0 (when the output voltage of the operational amplifier 103H is higher than the output voltage of the operational amplifier 103L), the switch control circuit 105 controls the turn-on and turn-off of the complementary analog switches S0 to S340 so that a voltage of one end (terminal on the operational amplifier 103L side) of the resistor RL(k) is propagated to the non-inverting input terminal (positive terminal) of the operational amplifier 104, in a case where 8 bits of bits 7 to 0 in the digital codes are k (k=0 to 255). In addition, when bit 8 in the digital code is 1 (when an output voltage of the operational amplifier 103L is higher than an output voltage of the operational amplifier 103H), the switch control circuit 105 controls the turn-on and turn-off of the complementary analog switches S0 to S340 so that a voltage of the other end (terminal on the operational amplifier 103H side) of the resistor RL(255-k) is propagated to the non-inverting input terminal (positive terminal) of the operational amplifier 104, in a case where 8 bits of bits 7 to 0 in the digital codes are k (k=0 to 255).

The low-order DAC 102 configured in this manner selects any one voltage in 256 types of voltages obtained by dividing a voltage between the output terminal of the operational amplifier 103H and the output terminal of the operational amplifier 103L by the resistors RL0 to RL255 in accordance with low-order 8 bits (bits 7 to 0) in the digital codes, and outputs the selected voltage to the outside of the D/A conversion circuit 100 through the operational amplifier 104.

Meanwhile, as described above, the output voltage of the operational amplifier 103H is higher than the output voltage of the operational amplifier 103L in accordance with the value of bit 8 in the digital code, or vice versa. For this reason, in the low-order DAC 102, a complementary analog switch is used instead of a switch constituted by either a P-channel type MOS transistor or an N-channel type MOS transistor.

The D/A conversion circuit 100 configured in this manner selects and outputs any one of $2^{16}$ (=65536) types of voltages divided from a reference voltage Vref in accordance with 16-bit digital codes.

The accuracy of the output voltage of the low-order DAC 102 included in the D/A conversion circuit 100 depends on not only resistance values of the respective resistors RL0 to RL255 but also differences between the resistance values. In the layout design of the low-order DAC 102, the resistors RL0 to RL255 are constituted by a resistive element and a plurality of contacts (equivalent to terminals of the respective resistors) which are provided in the resistive element. When a distance between the contacts is kept constant with the width of the resistive element kept constant, the resistors RL0 to RL255 can be made to have substantially the same (difference of approximately 0) resistance value. For this reason, the length of the resistive element can be matched to the width in a longitudinal direction of a region in which 257 complementary analog switches located at the first stage are arranged. Accordingly, in order to make the layout area as small as possible while maintaining the output accuracy of the low-order DAC 102, it is important to efficiently dispose 257 complementary analog switches located at the first stage with as small an area as possible.

In order to efficiently dispose the complementary analog switches, for example, it is preferable to dispose a P-channel type MOS transistor constituting each complementary analog switch so as to face one end (side surface) of the resistive element which is parallel to the longitudinal direction when seen in a plan view of the semiconductor substrate, and to commonize the drain of a P-channel type MOS transistor S(2j+1)(P) constituting a complementary analog switch S(2j+1) (j=0 to 127) and the drain of a P-channel type MOS transistor S(2j) (P) constituting a complementary analog switch S (2j). Similarly, when seen in a plan view of the semiconductor substrate, it is preferable to dispose an N-channel type MOS transistor constituting each complementary analog switch so as to face the other end (side surface) of the resistive element which is parallel to the longitudinal direction, and to commonize the source of an N-channel type MOS transistor S (2j+1) (N) constituting a complementary analog switch S (2j+1) and the source of an N-channel type MOS transistor S (2j) (N) constituting a complementary analog switch S (2j). In addition, it is possible to match a pitch of a contact (equivalent to a terminal of each resistor) which is formed in the resistive element in the longitudinal direction to both a pitch of a source contact of a P-channel type MOS transistor and a pitch of a drain contact of an N-channel type MOS transistor. Further, it is preferable to dispose the contacts formed in the resistive element and the above-mentioned source contacts or drain contacts on the same straight line, in consideration of the efficiency of wirings (minimization of a wiring region) for connecting 256 resistors RL0 to RL255 and 257 complementary analog switches located at the first stage.

Figure 3:
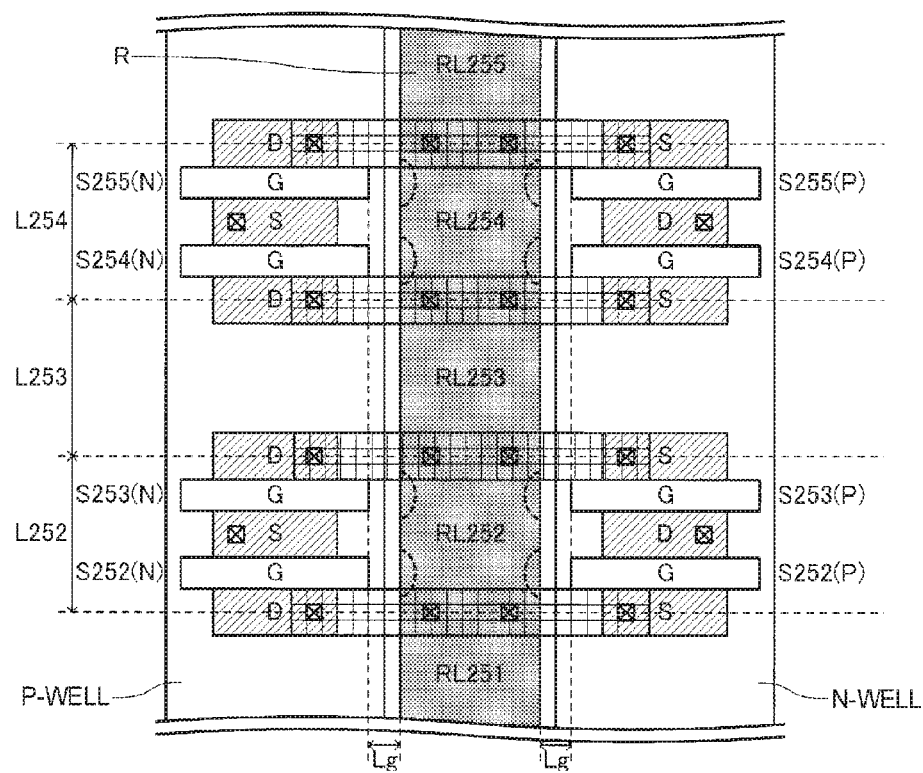
FIG. 3 is a diagram illustrating the layout of a portion of a D/A conversion circuit according to a comparative example.

When the layout design is performed in consideration of these conditions, the layout in the vicinity of the resistor RL253 is as illustrated in FIG. 3. In FIG. 3, a distance (length of the resistor RL254) L254 between the contacts at both ends of the resistor RL254 is matched to a distance between source contacts of two P-channel type MOS transistors S255 (P) and S254 (P) and a distance between drain contacts of two N-channel type MOS transistors S255 (N) and S254 (N), and these contacts are all disposed on the same straight line. Similarly, a distance (length of the resistor RL252) between contacts at both ends of the resistor RL252 is matched to a distance between source contacts of two P-channel type MOS transistors S253 (P) and S252 (P) and a distance between drain contacts of two N-channel type MOS transistors S253 (N) and S252 (N), and these contacts are all disposed on the same straight line. The length L254 of the resistor RL254 and the length L252 of the resistor RL252 are set to be the same value, and the length (distance between contacts of both ends) L253 of the resistor RL253 is also set to be the same value as the lengths L252 and L254.

As illustrated in FIG. 3, two P-channel type MOS transistors and two N-channel type MOS transistors are disposed with each of the resistor RL254 and the resistor RL252 interposed therebetween, while no MOS transistor is disposed on both sides of the resistor RL255, the resistor RL253, and the resistor RL251. In general, two P-channel type MOS transistors S (j+1) (P) and S (j) (P) and two N-channel type MOS transistors S (j+1) (N) and S (j) (N) are disposed with a resistor RL (2j) (j=0 to 127) interposed therebetween, while no MOS transistor is disposed on both sides of a resistor RL (2j+1).

Figure 17A:
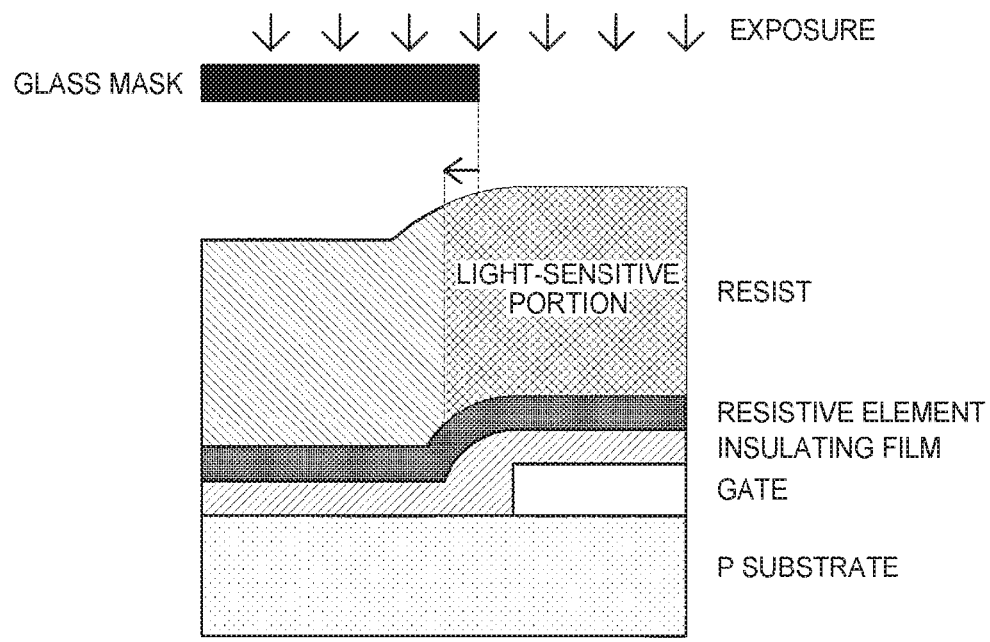
FIGS. 17A and 17B are diagrams illustrating a problem when there is an attempt to reduce the area of a D/A converter.
Figure 17B:
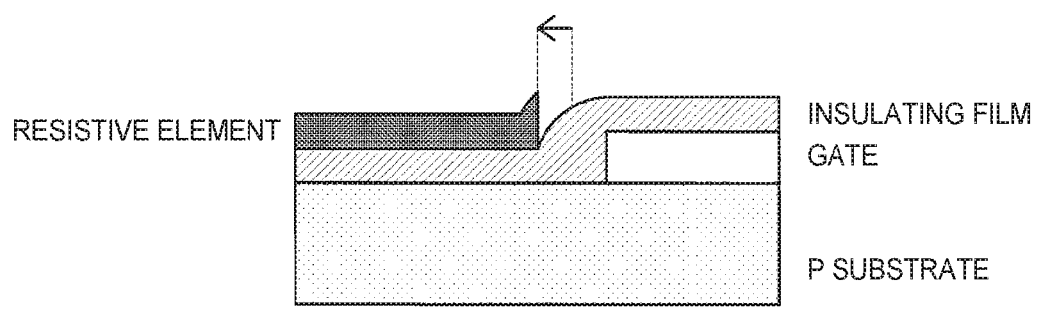

Here, when there is an attempt to make an interval Lg between a resistive element R and a gate electrode G of each MOS transistor, which are formed in the same layer (for example, a polysilicon layer), smaller than a minimum value of a design rule in order to further reduce the layout area of the low-order DAC 102, recesses as indicated by dashed lines of FIG. 3 are formed in portions of the side surfaces of the resistive element R which face gate electrodes of the MOS transistors S255 (P), S254 (P), S253 (P), S252 (P), S255 (N), S254 (N), S253 (N), and S252 (N), when seen in a plan view of the semiconductor substrate, for reasons described in FIGS. 17A and 17B in the D/A conversion circuit 100 manufactured. The resistors RL254 and RL252 similarly become thinner by the recesses. However, a gate electrode is not present on the side surface of the resistive element R which correspond to the resistors RL255, RL253, and RL251, and thus a recess is not formed. In general, a resistance value of a resistor RL (2$j$) ($j$=0 to 127) becomes relatively larger than a resistance value of a resistor RL (2$j$+1).

Figure 4:
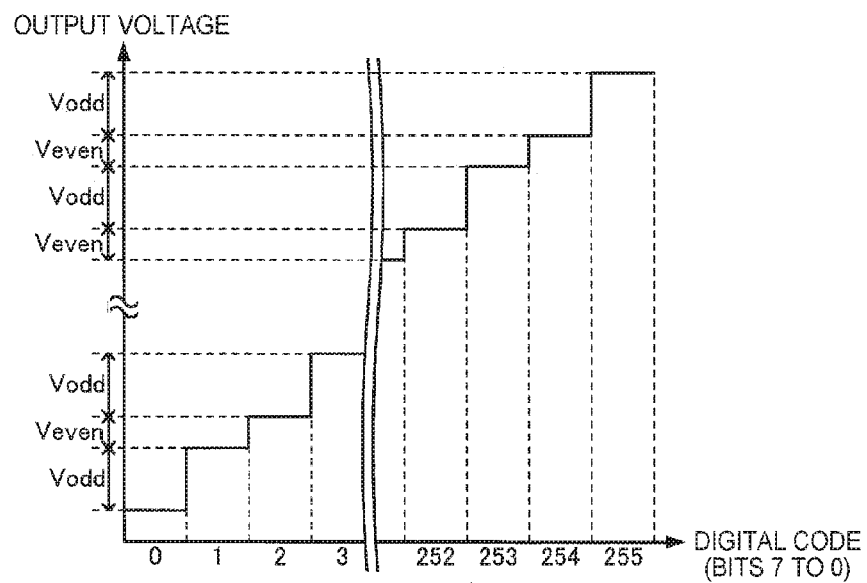
FIG. 4 is a diagram illustrating a problem when the layout of the comparative example is adopted.

In this case, voltages at both ends of the resistor RL (2$j$) become larger than voltages at both ends of the resistor RL (2$j$+1), and thus an increment Vodd of an output voltage when high-order 8 bits in digital codes are fixed and the values of low-order 8 bits are incremented by 1 from an even number as illustrated in FIG. 4 becomes larger than an increment Veven of an output voltage when the values of low-order 8 bits are incremented by 1 from an Vodd number, which results in a deterioration in differential non-linearity (DNL) of the D/A conversion circuit 100. As a result, the output accuracy of the D/A conversion circuit 100 deteriorates.

Figure 5:
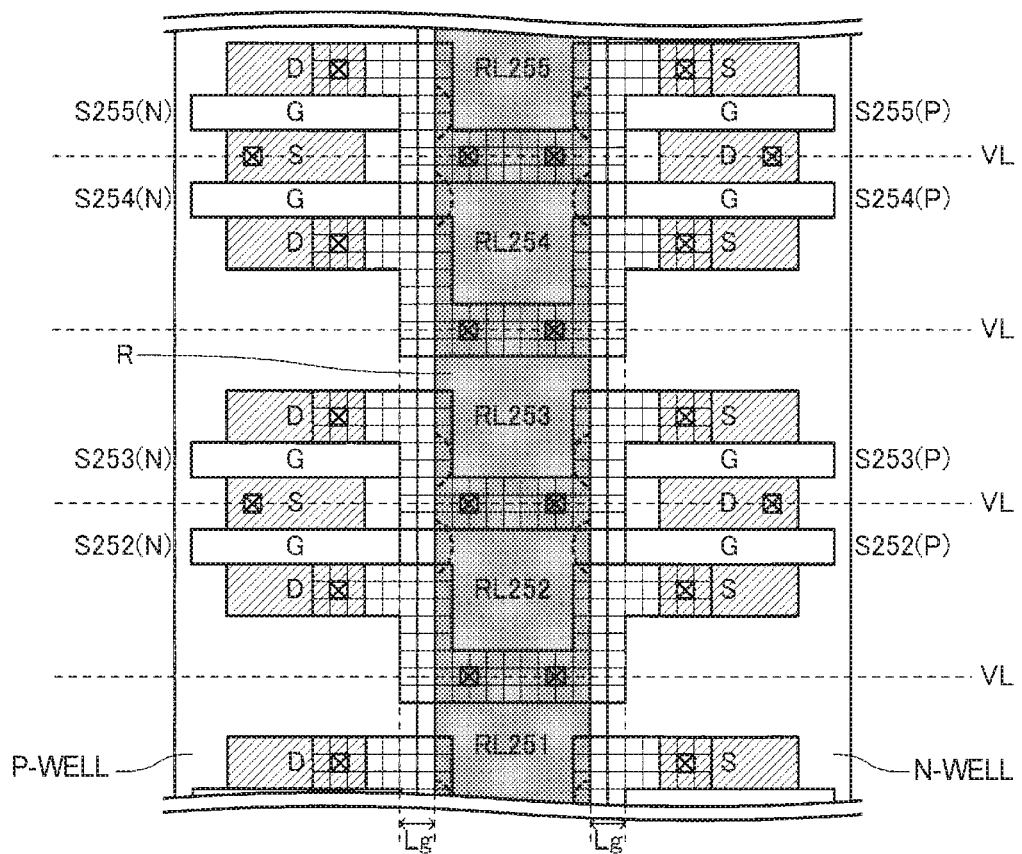
FIG. 5 is a diagram illustrating the layout of a portion of the D/A conversion circuit according to the first embodiment.

Consequently, in the present embodiment, as illustrated in FIG. 5, the P-channel type MOS transistors and the N-channel type MOS transistors constituting the complementary analog switches S0 to S255 are moved in the longitudinal direction of the resistive element R with respect to the layout of FIG. 3 so that, for example, contacts of the resistive element R, drain contacts of the P-channel type MOS transistors, and source contacts of the N-channel type MOS transistors are positioned on the same straight line. Thereby, when seen in a plan view of the semiconductor substrate, the MOS transistors are disposed so that a virtual straight line VL perpendicular to the longitudinal direction of the resistive element R passes between gate electrodes of two adjacent MOS transistor through the contacts provided in the resistive element R.

By this arrangement, when seen in a plan view of the semiconductor substrate, recesses having the same size are formed in portions of the side surface of the resistive element R which face the gate electrodes of the respective MOS transistors, that is, along the gate electrodes similarly with respect to the resistors RL0 to RL255. As a result, since all the resistance values of the resistors RL0 to RL255 become substantially the same as each other, DNL becomes substantially constant in all the ranges in which the values of digital codes are 0 to 65535(=$2^{16}$−1), and thus the output accuracy of the D/A conversion circuit 100 does not deteriorate.

In addition, in the present embodiment, the P-channel type MOS transistors and the N-channel type MOS transistors constituting the complementary analog switches S0 to S255 may be moved in the longitudinal direction of the resistive element R with respect to the layout of FIG. 3, and thus it is not necessary to increase the layout area. In addition, gate electrodes having the same width are disposed at positions facing the respective resistors RL0 to RL255 at the same intervals (distances), and thus resistance values of the resistors RL0 to RL255 are all set to be substantially the same as each other. For this reason, the interval (distance) Lg between the resistive element R and each gate electrode can be set to be a value contrary to a design rule, and can be reduced to, for example, a value equal to or less than 1 μm. Thereby, it is possible to reduce the layout area of the D/A conversion circuit 100.

As described above, according to the D/A conversion circuit 100 of the first embodiment, gate electrodes are disposed so as to face the resistors RL0 to RL255 in the low-order DAC 102, and thus the resistors RL0 to RL255 similarly have a recess formed therein and have a small difference between the resistance values thereof. That is, according to the D/A conversion circuit 100 of the first embodiment, since voltage dividing ratios of the resistors RL0 to RL255 becomes close to a constant value, DNL is maintained substantially constant, and thus it is possible to improve the accuracy of an output voltage.

In addition, according to the D/A conversion circuit 100 of the first embodiment, the resistive element R is disposed to be closer to a gate electrode of each MOS transistor as the resistive element has more recesses, that is, as the degree of contravention of a design rule becomes higher, and thus a reduction in size can be achieved.

Therefore, according to the first embodiment, it is possible to realize the D/A conversion circuit which is highly accurate and has a small size.

1-2. Second Embodiment

Figure 6:
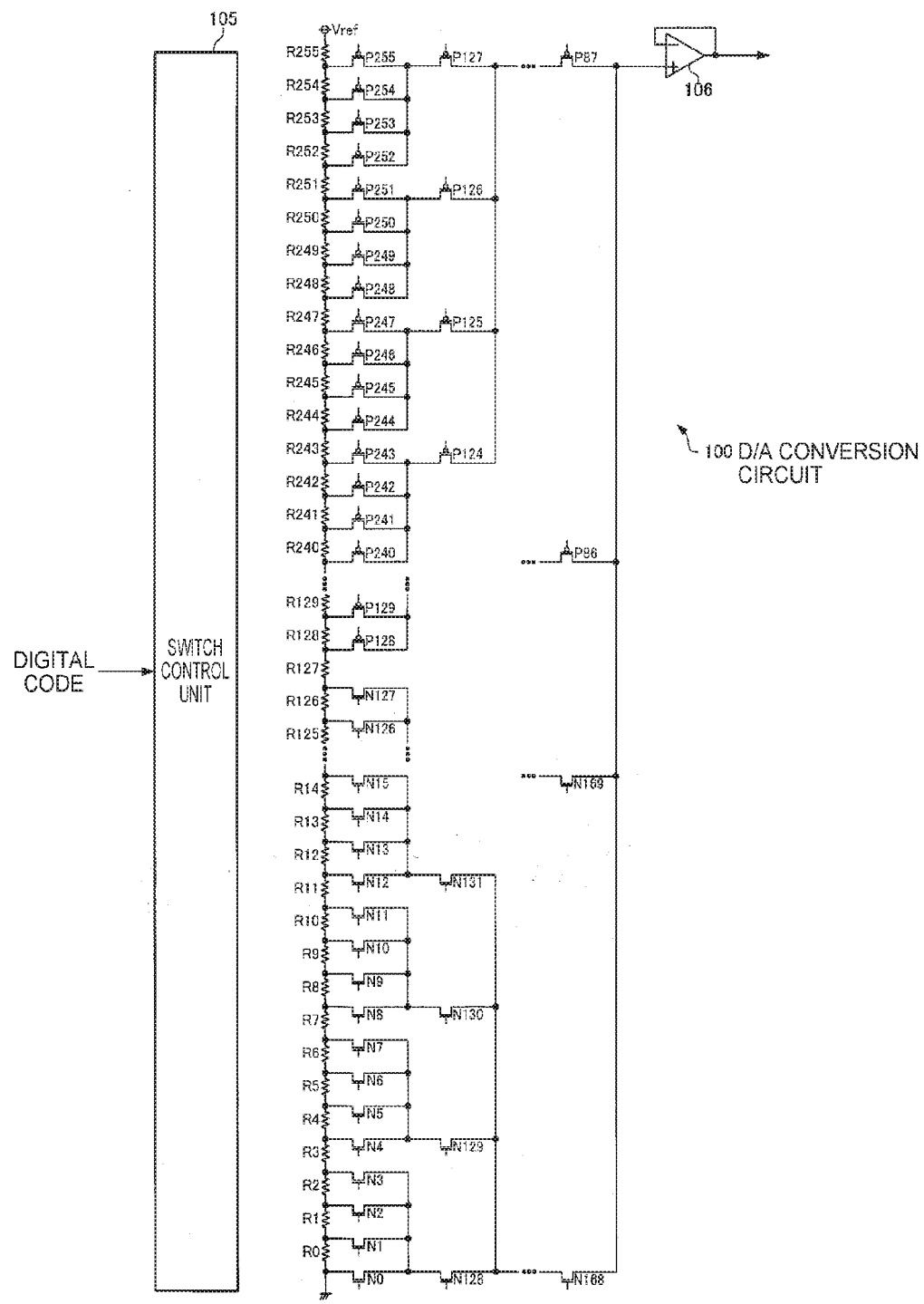
FIG. 6 is a diagram illustrating a configuration of a D/A conversion circuit according to a second embodiment.

FIG. 6 is a diagram illustrating a configuration of a D/A conversion circuit according to a second embodiment. A D/A conversion circuit 100 of the second embodiment is configured to include 256 resistors R0 to R255, 170 P-channel type MOS transistors P86 to P255, 170 N-channel type MOS transistors N0 to N169, a switch control circuit 105, and an operational amplifier 106. The D/A conversion circuit 100 of the second embodiment is a resistance voltage division type D/A conversion circuit, and outputs 256 types of voltages depending on input values of 8-bit digital codes.

Here, 256 resistors R0 to R255 (examples of a plurality of resistors) are connected to each other in series between a ground and a supply line of a reference voltage Vref.

In the resistor R127, a terminal on a high potential side is connected to a source of the P-channel type MOS transistor P128, and a terminal on a low potential side is connected to a drain of the N-channel type MOS transistor N127.

In each of the resistors R(n) (n=128 to 255) on the higher potential side than the resistor R127, one end (terminal on the low potential side) thereof is connected to a source of each of the P-channel type MOS transistors P(n), different from each other, which are located at a first stage, and the other end (terminal on the high potential side) thereof is connected to a source of each of the P-channel type MOS transistors P(n+1), different from each other, which are located at the first stage.

In each of the resistors R(n) (n=1 to 126) on the lower potential side than the resistor R127, one end (terminal on the low potential side) thereof is connected to a drain of each of the N-channel type MOS transistors N(n), different from each other, which are located at the first stage, and the other end (terminal on the high potential side) thereof is connected to a drain of each of the N-channel type MOS transistors N(n+1), different from each other, which are located at the first stage.

Here, 128 P-channel type MOS transistors P128 to P255 (examples of a plurality of MOS transistors) which are located at the first stage have drains connected to each other for every four transistors from the high potential side, and are connected to the respective sources of 32 P-channel type MOS transistors P96 (not shown) to P127 located at a second stage. For example, the drains of four P-channel type MOS transistors P255, P254, P253, and P252 located at the first stage are connected to the source of the P-channel type MOS transistor P127 located at the second stage. In addition, the drains of four P-channel type MOS transistors P251, P250, P249, and P248 located at the first stage are connected to the source of the P-channel type MOS transistor P126 located at the second stage.

Hereinafter, similarly, 32 P-channel type MOS transistors P96 to P127 located at the second stage have drains connected to each other for every four transistors from the high potential side, and connected to the respective sources of eight P-channel type MOS transistors P88 to P95 (all of which are not shown in the drawing) which are located at a third stage. In addition, eight P-channel type MOS transistors P88 to P95 located at the third stage have drains connected to each other for every four transistors from the high potential side, and connected to the respective sources of two P-channel type MOS transistors P86 and P87 located at a fourth stage.

Here, 128 N-channel type MOS transistors N0 to N127 (examples of a plurality of MOS transistors) which are located at the first stage have sources connected to each other for every four transistors from the low potential side, and are connected to the respective drains of 32 N-channel type MOS transistors N128 to N159 (not shown) which are located at the second stage. For example, the sources of four N-channel type MOS transistors N0, N1, N2, and N3 located at the first stage are connected to the drain of the N-channel type MOS transistor N128 located at the second stage. In addition, the sources of four N-channel type MOS transistors N4, N5, N6, and N7 located at the first stage are connected to the drain of the N-channel type MOS transistor N129 located at the second stage.

Hereinafter, similarly, 32 N-channel type MOS transistors N128 to N159 located at the second stage have sources connected to each other for every four transistors from the low potential side, and are connected to the respective drains of eight N-channel type MOS transistors N160 to N167 (all of which are not shown in the drawing) which are located at the third stage. In addition, eight N-channel type MOS transistors N160 to N167 located at the third stage have sources connected to each other for every four transistors from the low potential side, and are connected to the respective drains of two N-channel type MOS transistors N168 and N169 located at the fourth stage.

The drains of two P-channel type MOS transistors P86 and P87 located at the fourth stage are connected to the sources of two N-channel type MOS transistors N168 and N169 located at the fourth stage, and are connected to a non-inverting input terminal (positive terminal) of the operational amplifier 106.

The operational amplifier 106 has an output terminal and an inverting input terminal (negative terminal) connected to each other, and functions as a voltage follower that propagates a voltage of a non-inverting input terminal (positive terminal) to the output terminal.

The switch control circuit 105 has 8-bit digital codes input thereto, and controls the turn-on and turn-off of 170 P-channel type MOS transistors P86 to P255 and 170 N-channel type MOS transistors N0 to N169 in accordance with the values of the 8-bit digital codes (bits 7 to 0).

The switch control circuit 105 controls the turn-on and turn-off of 128 P-channel type MOS transistors P128 to P255 and 128 N-channel type MOS transistors N0 to N127 which are located at the first stage in accordance with 2-bit values of bits 7 and 6 in the digital codes.

Only one of four P-channel type MOS transistors P ($4m-1$), P ($4m-2$), P ($4m-3$), P ($4m-4$) (m=33 to 64) which are located at the first stage is turned on. The switch control circuit 105 turns on the P-channel type MOS transistor P ($4m-1$) in a case where 2 bits of bits 7 and 6 is "11", turns on the P-channel type MOS transistor P ($4m-2$) in a case of "10", turns on the P-channel type MOS transistor P ($4m-3$) in a case of "10", and turns on the P-channel type MOS transistor P ($4m-4$) in a case of "00".

In addition, only one of four N-channel type MOS transistors N ($4m-1$), N ($4m-2$), N ($4m-3$), and N ($4m-4$) (m=1 to 32) which are located at the first stage is turned on. The switch control circuit 105 turns on the N-channel type MOS transistor N ($4m-1$) in a case where 2 bits of bits 7 and 6 is "11", turns on the N-channel type MOS transistor N ($4m-2$) in a case of "10", turns on the N-channel type MOS transistor N ($4m-3$) in a case of "01", and turns on the N-channel type MOS transistor N ($4m-4$) in a case of "00".

Here, 32 sets of four P-channel type MOS transistors P ($4m-1$), P ($4m-2$), P ($4m-3$), and P ($4m-4$) (m=33 to 64) and 32 sets of four N-channel type MOS transistors N ($4m-1$), N ($4m-2$), N ($4m-3$), and N ($4m-4$) (m=1 to 32) are all turned on and turned off by the same control logic. For example, four P-channel type MOS transistors P255, P251, P247, and P243 and four N-channel type MOS transistors N15, N11, N7, and N3 are simultaneously set to be in an on state or an off state.

The switch control circuit 105 controls the turn-on and turn-off of MOS transistors located at the second, third, and fourth stages in accordance with 2-bit values of bits 5 and 4, 2-bit values of bits 3 and 2, and 2-bit values of bits 1 and 0 in the digital codes, by the same logic as that used to control the turn-on and turn-off of the MOS transistors located at the first stage.

The D/A conversion circuit 100 of the second embodiment which is configured in this manner selects any one of 256 types of voltages obtained by dividing a reference voltage Vref by the resistors R0 to R255 in accordance with 8-bit digital codes, and outputs the selected voltage to the outside through the operational amplifier 106.

As described above, in the D/A conversion circuit 100, 170 switches electrically connected to one side ends of resistors on the higher potential side than the resistor R127 are all constituted by a P-channel type MOS transistor, and 170 switches electrically connected to one side ends of resistors on the lower potential side than the resistor RM127 are all constituted by an N-channel type MOS transistor. Accordingly, an area occupied by the switches on a semiconductor substrate is reduced to approximately a half, compared to a case where the 340 switches are all constituted by a complementary analog switch (transfer gate).

In addition, the accuracy of the output voltage of the D/A conversion circuit 100 depends on not only resistance values of the respective resistors R0 to R255 but also differences between the resistance values. For this reason, in the layout design of the D/A conversion circuit 100, the length of a resistive element, having a constant width, which constitutes the resistors R0 to R255 can be matched to the width in a longitudinal direction of a region in which 256 MOS transistors located at the first stage are arranged. In other words, in order to make the layout area of the D/A conversion circuit 100 as small as possible, it is important to efficiently dispose 256 MOS transistors located at the first stage with as small an area as possible.

In order to efficiently dispose the MOS transistors, for example, it is preferable to dispose a P-channel type MOS transistor on one side surface side of the resistive element in the longitudinal direction and to commonize the drain of a P-channel type MOS transistor P ($2j+1$) (j=64 to 127) and the drain of a P-channel type MOS transistor P ($2j$). Similarly, it is preferable to dispose an N-channel type MOS transistor on the same side surface side of the resistive element in the longitudinal direction and to commonize the source of an N-channel type MOS transistor N ($2j+1$) (j=0 to 63) and the source of an N-channel type MOS transistor N($2j$). In addition, it is preferable to match a pitch of a contact (equivalent to a terminal of each resistor) which is formed in the resistive element in the longitudinal direction to both a pitch of a source contact of a P-channel type MOS transistor and a pitch of a drain contact of an N-channel type MOS transistor. Further, it is preferable to dispose the contact formed in the resistive element and the above-mentioned source contact and drain contact on the same straight line, in consideration of the efficiency of a wiring (minimization of a wiring region) for connecting 256 resistors R0 to R255 and 256 MOS transistors located at the first stage.

Figure 7:
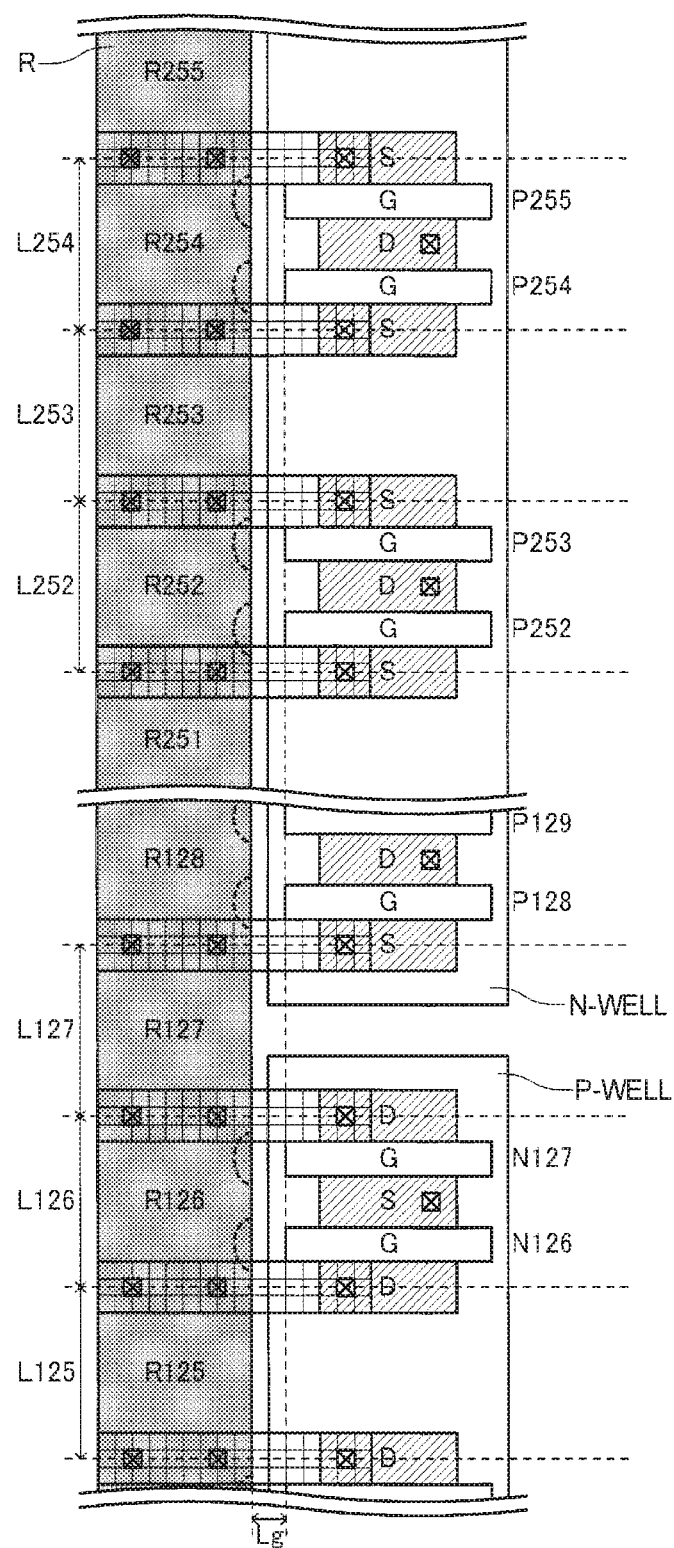
FIG. 7 is a diagram illustrating the layout of a portion of the D/A conversion circuit according to the comparative example.

When the layout design is performed in consideration of these conditions, the layout of the vicinity of the resistor R253 and the resistor R127 is as illustrated in FIG. 7. In FIG. 7, a distance (length of the resistor R254) L254 between the contacts at both ends of the resistor R254 is matched to a distance between source contacts of two P-channel type MOS transistors P255 and P254, and these contacts are all disposed on the same straight line. Similarly, a distance (length of the resistor R252) between contacts at both ends of the resistor R252 is matched to a distance between source contacts of two P-channel type MOS transistors P253 and P252, and these contacts are all disposed on the same straight line. In addition, a distance (length of the resistor R126) between contacts at both ends of the resistor R126 is matched to a distance between drain contacts of two N-channel type MOS transistors P127 and P126, and these contacts are all disposed on the same straight line. The length L254 of the resistor R254, the length L252 of the resistor R252, and the length L126 of the resistor R126 are set to be the same value, and the lengths (distances between contacts at both ends) L253, L127 and L125 of the resistor R253, the resistor R127, and the resistor R125 are also set to be the same value as the lengths L254, L252 and L126.

As illustrated in FIG. 7, two P-channel type MOS transistors are disposed so as to face each of the resistor R254, the resistor R252, and the resistor R128, and two N-channel type MOS transistors are disposed so as to face the resistor R126. On the other hand, no MOS transistor is disposed at positions facing the resistor R255, the resistor R253, the resistor R251, the resistor R127, and the resistor R125. In general, two P-channel type MOS transistors P (j+1) and P (j) are disposed so as to face a resistor R ($2j$) (j=64 to 127), and two N-channel type MOS transistors N (k+1) and N(k) are disposed so as to face a resistor R ($2k$) (k=0 to 63). On the other hand, no MOS transistor is disposed on both sides of each of a resistor R ($2j+1$) and a resistor R ($2k+1$).

Accordingly, when there is an attempt to make an interval Lg between a resistive element R and a gate electrode G of each MOS transistor, which are formed in the same layer (for example, a polysilicon layer), smaller than a minimum value of a design rule in order to further reduce the layout area of the D/A conversion circuit 100, recesses as indicated by dashed lines of FIG. 7 are formed in portions of the side surfaces of the resistive element R which face gate electrodes of the MOS transistors P255, P254, P253, P252, P129, P128, N127, and N126, when seen in a plan view of the semiconductor substrate, for reasons described in FIGS. 17A and 17B in the D/A conversion circuit 100 manufactured. The resistors R254, R252, R128, and R126 similarly become thinner by the recesses. However, a gate electrode is not present on the side surface of the resistive element R which correspond to the resistors R255, R253, R251, R127, and R125, and thus a recess is not formed. In general, a resistance value of a resistor R ($2j$) (j=0 to 127) becomes relatively larger than a resistance value of a resistor R ($2j+1$).

In this case, voltages at both ends of the resistor R ($2j$) become larger than voltages at both ends of the resistor R ($2j+1$), and thus the differential non-linearity (DNL) of the D/A conversion circuit 100 deteriorates. As a result, the output accuracy of the D/A conversion circuit 100 deteriorates.

Figure 8:
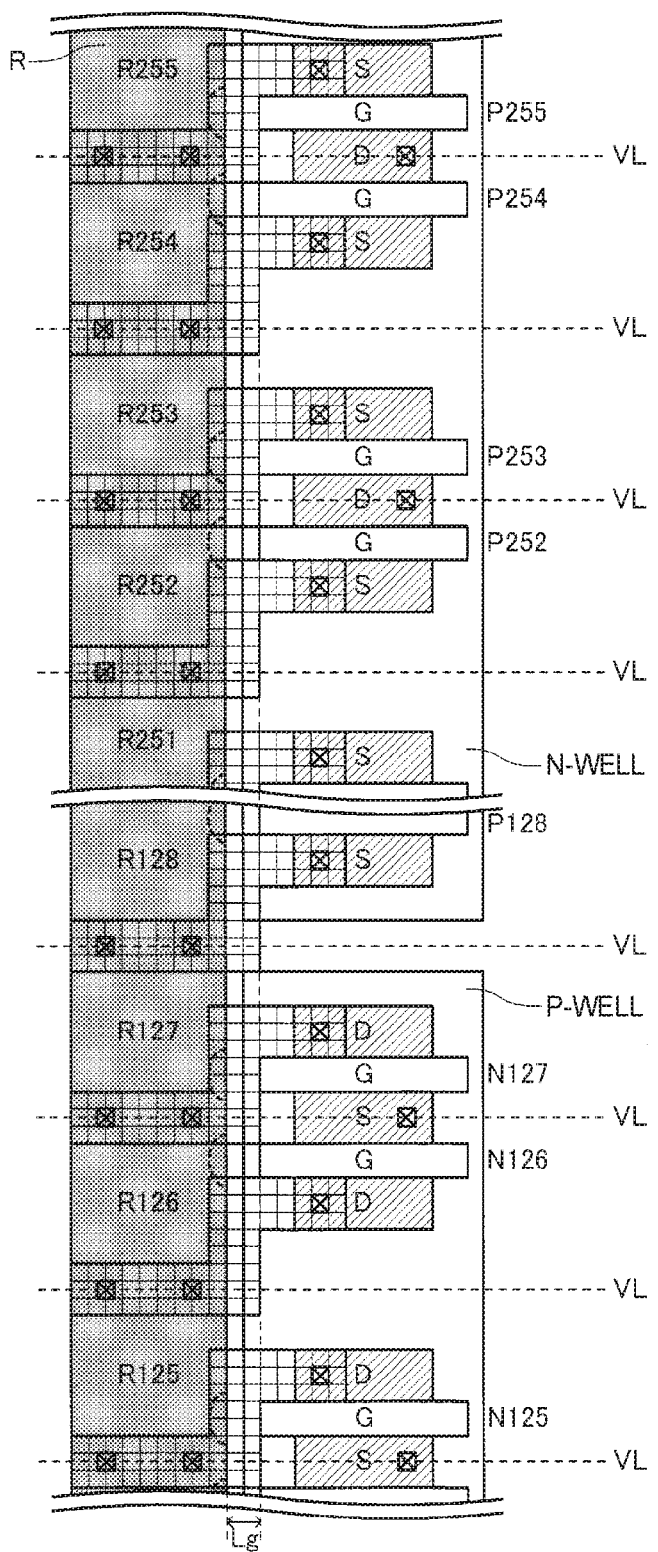
FIG. 8 is a diagram illustrating the layout of a portion of the D/A conversion circuit according to the second embodiment.

Consequently, in the present embodiment, as illustrated in FIG. 8, the P-channel type MOS transistors P128 to P255 and the N-channel type MOS transistors N0 to N127 are moved in the longitudinal direction of the resistive element R with respect to the layout of FIG. 7 so that, for example, contacts of the resistive element and drain contacts of the P-channel type MOS transistors or source contacts of the N-channel type MOS transistors are positioned on the same straight line. Thereby, when seen in a plan view of the semiconductor substrate, the MOS transistors are disposed so that a virtual straight line VL perpendicular to the longitudinal direction of the resistive element R passes between gate electrodes of two adjacent MOS transistors through the contacts provided in the resistive element R.

By this arrangement, when seen in a plan view of the semiconductor substrate, recesses having the same size are formed in portions of the side surface of the resistive element R which face the gate electrodes of the respective MOS transistors, that is, along the gate electrodes similarly with respect to the resistors R0 to R255. As a result, since all the resistance values of the resistors R0 to R255 become substantially the same as each other, DNL becomes substantially constant in all the ranges in which the values of digital codes are 0 to 256 (=$2^8$–1), and thus the output accuracy of the D/A conversion circuit 100 does not deteriorate.

In addition, in the present embodiment, the P-channel type MOS transistors P128 to P255 and the N-channel type MOS transistors N0 to N127 may be moved in the longitudinal direction of the resistive element R with respect to the layout of FIG. 7, and thus it is not necessary to increase the layout area. In addition, gate electrodes having the same width are disposed at the same intervals (distances) at positions facing the respective resistors R0 to R255, and thus resistance values of the resistors R0 to R255 are all set to be substantially the same as each other. For this reason, the interval (distance) Lg between the resistive element R and each gate electrode can be set to be a value contrary to a design rule, and can be reduced to, for example, a value equal to no less than 1 μm. Thereby, it is possible to reduce the layout area of the D/A conversion circuit 100.

As described above, according to the D/A conversion circuit 100 of the second embodiment, gate electrodes are disposed so as to face the resistors R0 to R255, and thus the resistors R0 to R255 similarly have a recess formed therein and have a small difference between the resistance values thereof. That is, according to the D/A conversion circuit 100 of the second embodiment, since voltage dividing ratios of the resistors R0 to R255 become closer to a constant value, DNL is maintained substantially constant, and thus it is possible to improve the accuracy of an output voltage.

In addition, according to the D/A conversion circuit 100 of the second embodiment, the resistive element R is disposed to be closer to agate electrode of each MOS transistor as the resistive element has more recesses, that is, as the degree of contravention of a design rule becomes higher, and thus a reduction in size can be achieved.

Therefore, according to the second embodiment, it is possible to realize the D/A conversion circuit which is highly accurate and has a small size.

1-3. Third Embodiment

Figure 9:
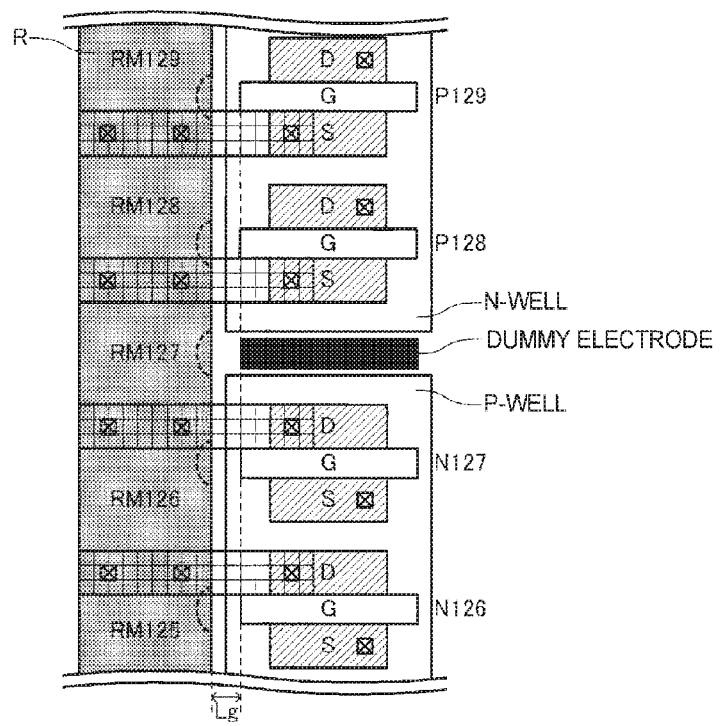
FIG. 9 is a diagram illustrating the layout of a portion of a D/A conversion circuit according to a third embodiment.

FIG. 9 is a diagram illustrating the layout of a portion of a D/A conversion circuit according to a third embodiment.

As illustrated in FIG. 9, in the third embodiment, a dummy electrode T different from an electrode of any of MOS transistors is disposed so as to face a resistor RM127 having no opposite gate electrode, at a position where the same interval as an interval between each of other resistors and an opposite gate electrode is set. The dummy electrode T has a width which is the same as the width of the gate electrode of each MOS transistor, and is formed in the same layer (for example, a polysilicon layer) in which the gate electrode is formed. Meanwhile, in FIG. 9, the length pf the dummy electrode T and the length of the gate electrode of each MOS transistor are the same as each other, but may not necessarily be the same as each other.

By the arrangement of the dummy electrode T, similarly to the recesses formed in portions (resistors RM0 to RM126 and the resistors RM128 to RM255) of the side surface of the resistive element R which face the gate electrodes of the respective MOS transistors along the respective gate electrodes when seen in a plan view of the semiconductor substrate, a recess having the same size is also formed in a portion (resistor RM127) which faces the dummy electrode T along the dummy electrode T, as indicated by a dashed line of FIG. 9. The resistor RM127 also becomes thinner by this recess, similar to the other resistors. As a result, since all the resistance values of the resistors RM0 to RM255 become substantially the same as each other, the output sensitivity of the D/A conversion circuit 100 becomes substantially constant in all the ranges in which the values of digital codes are 0 to 65535 ($=2^{16}-1$), and thus the output accuracy of the D/A conversion circuit 100 does not deteriorate.

In addition, in the present embodiment, the dummy electrode T can be disposed in a vacant space, and thus it is not necessary to increase the layout area in order to dispose the dummy electrode T. In addition, the dummy electrode T having the same width as the width of the gate electrode facing each of the other resistors is disposed at the same interval at a position facing the resistor RM127, and thus the resistance values of the resistors RM0 to RM255 are all set to be substantially the same as each other. For this reason, the interval (distance) Lg between the resistive element R and each gate electrode or the dummy electrode T can be set to be a value contrary to a design rule, and can be reduced to, for example, a value equal to or less than 1 μm. Thereby, it is possible to reduce the layout area of the D/A conversion circuit 100.

As described above, according to the D/A conversion circuit 100 of the third embodiment, the dummy electrode T is disposed so as to face the resistor RM127 which is the only transistor that does not face a MOS transistor, among the resistors RM0 to RM255, in a high-order DAC 101, and thus the resistors RM0 to RM255 similarly have a recess formed therein and have a small difference between the resistance values thereof. That is, according to the D/A conversion circuit 100 of the third embodiment, since voltage dividing ratios of the resistors RM0 to RM255 become closer to a constant value, and thus it is possible to improve the accuracy of an output voltage generated on the basis of voltage division.

In addition, according to the D/A conversion circuit 100 of the third embodiment, the resistive element R is disposed to be closer to a gate electrode of each MOS transistor or the dummy electrode T as the resistive element has more recesses, that is, as the degree of contravention of a design rule becomes higher, and thus a reduction in size can be achieved.

Therefore, according to the third embodiment, it is possible to realize the D/A conversion circuit which is highly accurate and has a small size.

1-4. Fourth Embodiment

Figure 10:
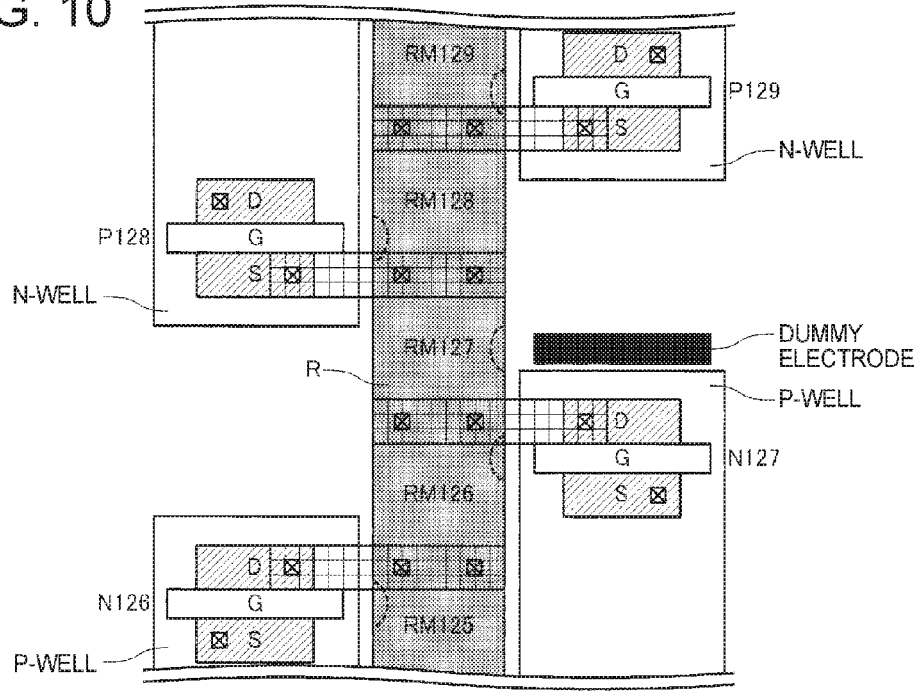
FIG. 10 is a diagram illustrating the layout of a portion of a D/A conversion circuit according to a fourth embodiment.

FIG. 10 is a diagram illustrating the layout of a portion of a D/A conversion circuit according to a fourth embodiment. In detail, FIG. 10 is a diagram illustrating the layout of the vicinity of a resistor RM127 of a high-order DAC 101 in the fourth embodiment. As illustrated in FIG. 10, in the high-order DAC 101 in the fourth embodiment, P-channel type MOS transistors P129 and P128 and N-channel type MOS transistors N127 and N126 are disposed in zigzags (alternately) with a resistive element R interposed therebetween when seen in a plan view of a semiconductor substrate. In addition, similarly to FIG. 9, an interval between the resistive element R and a gate electrode G of each MOS transistor is smaller than a minimum value of a design rule, and a dummy electrode T similar to that in the third embodiment is disposed so as to face a resistor RM127 having no opposite gate electrode at a position where the same interval as an interval between each of other resistors and an opposite gate electrode is set. The dummy electrode T may be disposed on the same side as the gate electrode of the N-channel type MOS transistor N127 as illustrated in FIG. 10 with respect to the resistive element R, or may be disposed on the same side as the gate electrode of the P-channel type MOS transistor P128. In either case, the dummy electrode T is formed in the same layer (for example, a polysilicon layer) as the gate electrode.

Meanwhile, a positional relationship between a resistor RM(n) (n=130 to 255) and a P-channel type MOS transistor P(n) is the same as a positional relationship between a resistor RM128 and the P-channel type MOS transistor P128. Similarly, a positional relationship between a resistor RM(n) (n=0 to 125) and an N-channel type MOS transistor N(n+1) is the same as a positional relationship between a resistor RM126 and the N-channel type MOS transistor N127.

Also in the fourth embodiment, the dummy electrode T is disposed, and thus a recess as indicated by a dashed line of FIG. 10 is also generated in a portion facing the dummy electrode T, similar to portions of the side surface of the resistive element R which face gate electrodes of the respective MOS transistors, when seen in a plan view of a semiconductor substrate in a D/A conversion circuit 100 manufactured. The resistor RM127 also becomes thinner by this recess, similar to the other resistors. As a result, since all the resistance values of the resistors RM0 to RM255 become substantially the same as each other, the output sensitivity of the D/A conversion circuit 100 becomes substantially constant in all the ranges in which the values of digital codes are 0 to 65535 ($=2^{16}-1$), and thus the output accuracy of the D/A conversion circuit 100 does not deteriorate.

In addition, also in the fourth embodiment, the dummy electrode T can be disposed in a vacant space, and thus it is not necessary to increase the layout area in order to dispose the dummy electrode T. In addition, an interval (distance)

between the resistive element R and each gate electrode or the dummy electrode T can be set to be a value contrary to a design rule, and can be reduced to, for example, a value equal to ro less than 1 μm. Thereby, it is possible to reduce the layout area of the D/A conversion circuit 100.

According to the fourth embodiment described above, it is possible to realize the D/A conversion circuit which is highly accurate and has a small size.

1-5. Fifth Embodiment

Figure 11:
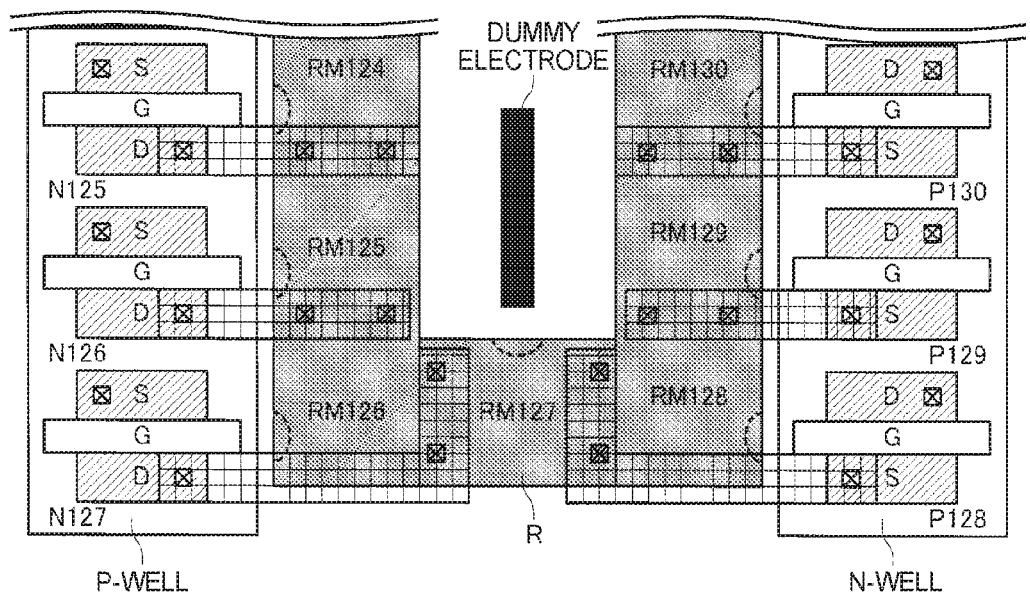
FIG. 11 is a diagram illustrating the layout of a portion of a D/A conversion circuit according to a fifth embodiment.

FIG. 11 is a diagram illustrating the layout of a portion of a D/A conversion circuit according to a fifth embodiment. In detail, FIG. 11 is a diagram illustrating the layout of the vicinity of a resistor RM127 of a high-order DAC 101 in the fifth embodiment. As illustrated in FIG. 11, in the high-order DAC 101 in the fifth embodiment, a resistive element R is bent in line symmetry centering on a portion of the resistor RM127 when seen in a plan view of a semiconductor substrate. In addition, P-channel type MOS transistors P130, P129, and P128 are disposed in one region along the resistive element R, and N-channel type MOS transistors N127, N126, and N125 are disposed in the other region along the resistive element R. In addition, similarly to FIG. 9, an interval between the resistive element R and a gate electrode G of each MOS transistor is smaller than a minimum value of a design rule, and a dummy electrode T similar to that in the third embodiment is disposed so as to face the resistor RM127 having no opposite gate electrode at a position where the same interval as an interval between each of other resistors and an opposite gate electrode is set. The dummy electrode T may be disposed above the resistive element R (on a side interposed between the resistive elements R) as illustrated in FIG. 11 with respect to the resistive element R, or may be disposed below the resistive element R (on the outer side of the resistive element R). In either case, the dummy electrode T is formed in the same layer (for example, a polysilicon layer) as the gate electrode.

Meanwhile, a positional relationship between a resistor RM(n) (n=131 to 255) and a P-channel type MOS transistor P(n) is the same as a positional relationship between a resistor RM129 and the P-channel type MOS transistor P129. Similarly, a positional relationship between a resistor RM(n) (n=0 to 123) and an N-channel type MOS transistor N(n+1) is the same as a positional relationship between a resistor RM125 and the N-channel type MOS transistor N126.

Also in the fifth embodiment, the dummy electrode T is disposed, and thus a recess as indicated by a dashed line of FIG. 11 is also generated in a portion facing the dummy electrode T, similar to portions of the side surface of the resistive element R which face gate electrodes of the respective MOS transistors, when seen in a plan view of the semiconductor substrate in a D/A conversion circuit 100 manufactured. The resistor RM127 also becomes thinner by this recess, similar to the other resistors. As a result, since all the resistance values of the resistors RM0 to RM255 become substantially the same as each other, the output sensitivity of the D/A conversion circuit 100 becomes substantially constant in all the ranges in which the values of digital codes are 0 to 65535 ($=2^{16}-1$), and thus the output accuracy of the D/A conversion circuit 100 does not deteriorate.

In addition, also in the fifth embodiment, the dummy electrode T can be disposed in a vacant space, and thus it is not necessary to increase the layout area in order to dispose the dummy electrode T. In addition, an interval (distance) between the resistive element R and each gate electrode or the dummy electrode T can be set to be a value contrary to a design rule, and can be reduced to, for example, a value equal to no less than 1 μm. Thereby, it is possible to reduce the layout area of the D/A conversion circuit 100.

Meanwhile, the resistive element R is bent in the vicinity of any resistor among the resistors RM0 to RM255. Thus, when a gate electrode facing the any resistor is not present, a dummy electrode T similar to that in the third embodiment is disposed so as to face the any resistor at a position where the same interval as an interval between each of other resistors and an opposite gate electrode is set.

According to the fifth embodiment described above, it is possible to realize the D/A conversion circuit which is highly accurate and has a small size.

2. Oscillator

Figure 12:
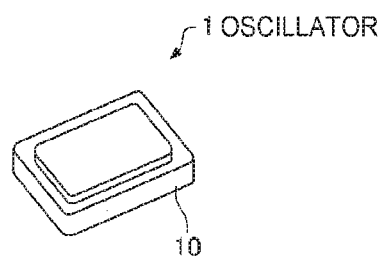
FIG. 12 is a perspective view of an oscillator according to the present embodiment.
Figure 13:
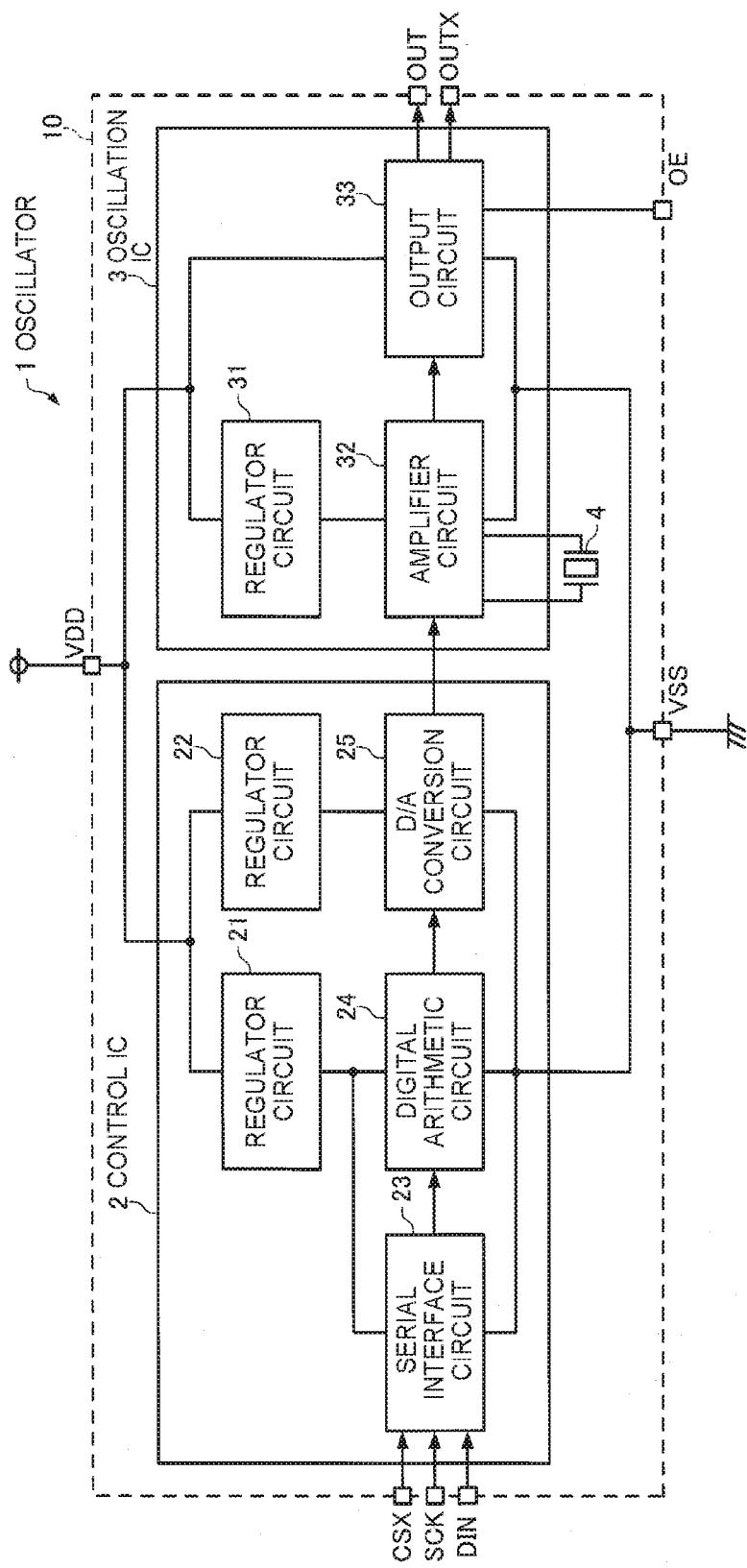
FIG. 13 is a diagram illustrating a configuration of the oscillator according to the present embodiment.

FIG. 12 is a perspective view of an oscillator according to the present embodiment. In addition, FIG. 13 is a diagram illustrating a configuration of an oscillator according to the present embodiment. An oscillator 1 according to the present embodiment is a digital control oscillator capable of controlling an oscillating frequency in response to a digital signal which is input from an external terminal, and is configured to include a control integrated circuit (IC) 2, an oscillation integrated circuit (IC) 3, a crystal vibrator 4, and a package (container) 10 mounted with the control IC 2, the oscillation IC 3, and the crystal vibrator 4, as illustrated in FIGS. 12 and 13.

The control IC 2 operates with a power voltage VDD being supplied to the power terminal thereof from a power terminal VDD of the oscillator 1 and a ground potential VSS being supplied to the ground terminal thereof from a ground terminal GND. Similarly, the oscillation IC 3 operates with a power voltage VDD being supplied to the power terminal thereof from the power terminal VDD of the oscillator 1 and a ground potential VSS being supplied to the ground terminal thereof from the ground terminal GND.

As illustrated in FIG. 13, the control IC 2 is configured to include a regulator circuit 21, a regulator circuit 22, a serial interface circuit 23, a digital arithmetic circuit 24, and a D/A conversion circuit 25.

The regulator circuit 21 is a voltage regulator that generates a constant voltage from the power voltage VDD and supplies the generated voltage to the serial interface circuit 23 and the digital arithmetic circuit 24.

The regulator circuit 22 is a voltage regulator that generates a constant voltage from the power voltage VDD and supplies the generated voltage to a power supply node of the D/A conversion circuit 25, or is a current regulator that generates a constant current from the power voltage VDD and supplies the generated current to the power supply node of the D/A conversion circuit 25.

The serial interface circuit 23 receives a chip select signal, a serial data signal, and a clock signal which are respectively input from three external terminals CSX, SCK, and DAIN of the oscillator 1 through three terminals of the control IC 2, acquires a serial data signal in synchronization with a clock signal when the chip select signal is in an active state, and outputs the acquired signal to the digital arithmetic circuit 24. The serial interface circuit 23 may be an interface circuit corresponding to, for example, a serial peripheral interface (SPI). Meanwhile, in the present embodiment, the serial interface circuit 23 is a three-wire type interface circuit, but is not limited thereto. For example, the serial interface circuit may be a two-wire type interface circuit corresponding to an inter-integrated circuit ($I^2C$).

The digital arithmetic circuit 24 converts a serial data signal output by the serial interface circuit 23 into an N-bit data signal, and outputs the converted signal.

The D/A conversion circuit 25 converts an N-bit data signal output by the digital arithmetic circuit 24 into an analog signal to thereby generate a control signal for controlling the oscillation IC 3, and outputs the generated signal from a terminal of the control IC 2. For example, a resistance voltage division type circuit can be used as the D/A conversion circuit 25.

The oscillation IC 3, which is connected to the crystal vibrator 4, resonates the crystal vibrator 4 with a frequency in response to a control signal output by the control IC 2 and outputs an oscillation signal. The oscillation signal is output to the outside of the oscillator 1 as a differential oscillation signal through two external terminals OUT and OUTX of the oscillator 1. In addition, the oscillation IC 3 controls a resonance frequency of the crystal vibrator 4 under the control of the control IC 2.

Meanwhile, the crystal vibrator 4 is an example of a resonator, and another resonator may be used instead of the crystal vibrator 4. The resonator may be an electrical resonance circuit, or may be an electromechanical resonator, or the like. The resonator may be, for example, a vibrator. The vibrator may be, for example, a piezoelectric vibrator, a surface acoustic wave (SAW) resonator, a micro electro mechanical systems (MEMS) vibrator, or the like. In addition, examples of a substrate material of the vibrator include a piezoelectric material such as piezoelectric single crystal, such as crystal, lithium tantalate or lithium niobate, or piezoelectric ceramics such as lead zirconate titanate, a silicon semiconductor material, and the like. As excitation means of the vibrator, means using a piezoelectric effect may be used, or electrostatic driving using Coulomb force may be used. In addition, the resonator may be an optical resonator that uses a gas cell having an alkali metal and the like accommodated therein and light interacting with atoms such as an alkali metal, a cavity resonator or a dielectric resonator which resonates in a microwave range, an LC resonator, or the like.

As illustrated in FIG. 13, the oscillation IC 3 is configured to include a regulator circuit 31, an amplifier circuit 32, and an output circuit 33.

The regulator circuit 31 is a current regulator that generates a constant current from a power voltage VDD and supplies the generated current to a power supply node of the amplifier circuit 32, or is a voltage regulator that generates a constant voltage from a power voltage VDD and supplies the generated voltage to the power supply node of the amplifier circuit 32.

The amplifier circuit 32 amplifies a signal output from the crystal vibrator 4 by, for example, a bipolar transistor operating by a current supplied from the regulator circuit 31, and feeds the amplified signal back to the crystal vibrator 4, thereby resonating the crystal vibrator 4. Alternatively, the amplifier circuit 32 may amplify a signal output from the crystal vibrator 4 by a CMOS inverter element operating by a voltage supplied from the regulator circuit 31, and feeds the amplified signal back to the crystal vibrator 4, thereby resonating the crystal vibrator 4.

The amplifier circuit 32 includes a variable capacitance element, not shown in the drawing, which functions as a load capacitance of the crystal vibrator 4. A voltage (control voltage) of a control signal output by the control IC 2 is applied to the variable capacitance element through a terminal of the oscillation IC 3, and the capacitance value thereof is controlled by the control voltage. An oscillating frequency of the crystal vibrator 4 varies depending on the capacitance value of the variable capacitance element.

Meanwhile, various oscillation circuits such as a pierced oscillation circuit, an inverter type oscillation circuit, a Colpitts oscillation circuit, and a Hartley oscillation circuit may be constituted by the amplifier circuit 32 and the crystal vibrator 4.

The output circuit 33 generates, for example, an oscillation signal by performing buffering or level shifting of a signal (input circuit of the crystal vibrator 4) which is amplified by the amplifier circuit 32, and outputs the generated signal. The output circuit 33 generates a differential oscillation signal corresponding to any of standards such as a low-voltage positive-referenced emitter coupled logic (LVPECL), low-voltage differential signals (LVDS), a high-speed current steering logic (HCSL). The output circuit 33 outputs an oscillation signal from two terminals of the oscillation IC 3 when an external terminal OE is in a high (H) level, and stops outputting an oscillation signal when the external terminal OE is in a low (L) level. The differential oscillation signal output from the oscillation IC 3 is output to the outside from two external terminals OUT and OUTX of the oscillator 1. Meanwhile, the output circuit 33 may generate a single-end oscillation signal such as a CMOS-level oscillation signal, and may output the generated signal to the outside from the external terminal OUT. In this case, the external terminal OUTX is not necessary.

The amplifier circuit 32, or the amplifier circuit 32 and the output circuit 33 function as an oscillation circuit for resonating the crystal vibrator 4.

The oscillation circuit constituted by the oscillation IC 3 and the crystal vibrator 4 functions as a voltage control crystal oscillation circuit that outputs an oscillation signal having a frequency in response to a voltage (control voltage) of a control signal output by the control IC 2.

Figure 14:
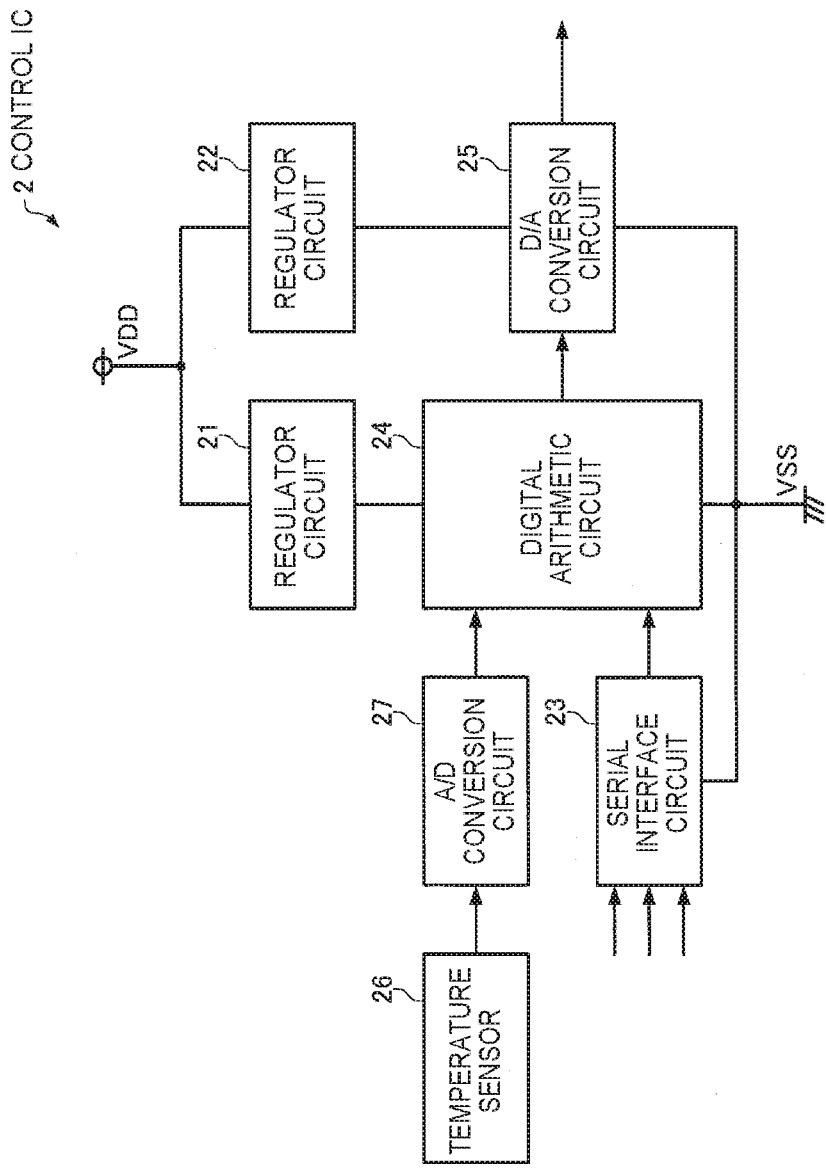
FIG. 14 is a diagram illustrating another configuration of a control IC in the oscillator according to the present embodiment.

In addition, the oscillator 1 according to the present embodiment may be configured such that the control IC 2 of FIG. 13 is replaced with a configuration of FIG. 14. In the example of FIG. 14, the control IC 2 may be configured to include a regulator circuit 21, a regulator circuit 22, a serial interface circuit 23, a digital arithmetic circuit 24, a D/A conversion circuit 25, a temperature sensor 26, and an A/D conversion circuit (analog to digital converter: ADC) 27.

The temperature sensor 26 is a temperature-sensitive element that outputs a signal (for example, a voltage depending on temperature) in response to an ambient temperature, and is realized by, for example, a configuration in which one or a plurality of diodes are connected to each other in series in a forward direction between the output thereof and a ground.

The A/D conversion circuit 27 converts an output signal of the temperature sensor 26 into a digital signal and outputs the converted signal. Various types of well-known circuits such as a parallel comparison type, a successive comparison type, a delta-sigma type, and a double integration type can be used as the A/D conversion circuit 27.

The digital arithmetic circuit 24 calculates a digital value of a temperature compensation voltage for compensating for frequency temperature characteristics of the crystal vibrator 4 using an output signal of the A/D conversion circuit 27, converts a serial data signal output by the serial interface circuit 23 into an N-bit digital value, adds up the digital value and the digital value of the temperature compensation voltage to thereby generate an N-bit data signal, and outputs the generated signal.

The D/A conversion circuit 25 converts the N-bit data signal into an analog signal to thereby generate a control signal for controlling the oscillation IC 3, and outputs the generated signal from a terminal of the control IC 2.

The oscillator 1 is a digital control temperature compensation type oscillator that maintains an oscillating frequency substantially constant irrespective of temperature and is capable of controlling an oscillating frequency in response to a digital signal which is input from an external terminal.

Meanwhile, the oscillator 1 according to the present embodiment is constituted by two chips of the control IC 2 and the oscillation IC 3, but may be constituted by an IC of one chip or may be constituted by ICs of three or more chips.

In the oscillator 1 according to the present embodiment, the D/A conversion circuit 100 of each of the above-described embodiments are used as the D/A conversion circuit 25, and thus it is possible to realize the oscillator which is highly accurate and has a small size.

3. Electronic Apparatus

Figure 15:
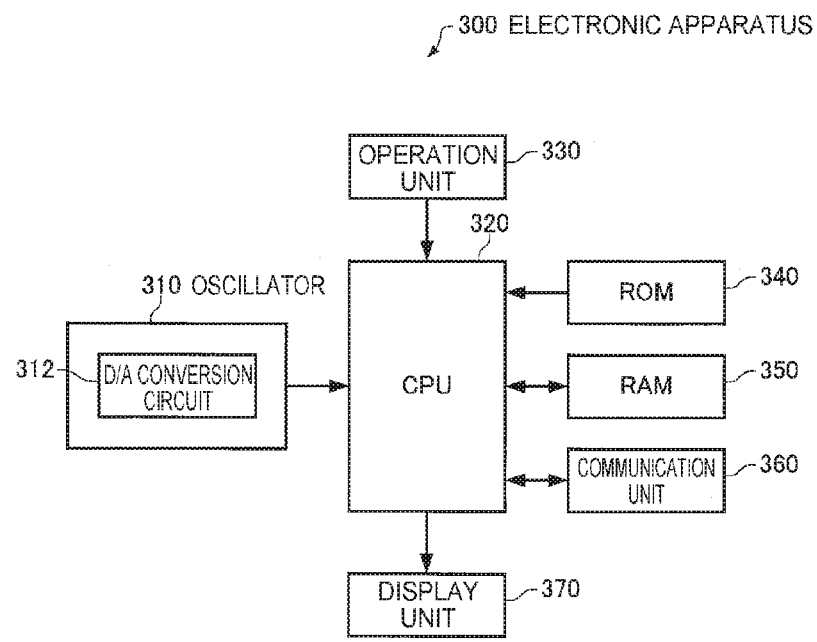
FIG. 15 is a functional block diagram illustrating an example of a configuration of an electronic apparatus according to the present embodiment.

FIG. 15 is a functional block diagram illustrating an example of a configuration of an electronic apparatus according to the present embodiment. An electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. Meanwhile, the electronic apparatus according to the present embodiment has a configuration in which some of components (respective portions) of FIG. 15 are omitted or changed, or may have a configuration in which other components are added.

The oscillator 310 has a resonator (not shown), an oscillation circuit (not shown) that resonates the resonator, and a D/A conversion circuit 312 for controlling the oscillation circuit which are built therein, and outputs an oscillation signal by the resonation of the resonator. The oscillation signal is supplied to the CPU 320 from the oscillator 310.

The CPU 320 performs various types of computation processes and control processes using an oscillation signal input from the oscillator 310 as a clock signal in accordance with a program stored in the ROM 340 or the like. Specifically, the CPU 320 performs various types of processes in response to an operation signal from the operation unit 330, a process of controlling the communication unit 360 in order to perform data communication with an external device, a process of transmitting a display signal for causing the display unit 370 to display a variety of information, and the like.

The operation unit 330 is an input device constituted by operation keys, button switches or the like, and outputs an operation signal in response to a user's operation to the CPU 320.

The ROM 340 stores a program, data or the like for causing the CPU 320 to perform various types of computation processes and control processes.

The RAM 350 is used as a work area of the CPU 320, and temporarily stores a program and data which are read out from the ROM 340, data which is input from the operation unit 330, arithmetic operation results executed by the CPU 320 in accordance with various types of programs, and the like.

The communication unit 360 performs a variety of control for establishing data communication between the CPU 320 and an external device.

The display unit 370 is a display device constituted by a liquid crystal display (LCD) or the like, and displays a variety of information on the basis of a display signal which is input from the CPU 320. The display unit 370 may be provided with a touch panel that functions as the operation unit 330.

For example, the D/A conversion circuit 100 of each of the above-described embodiments are used as the D/A conversion circuit 312, and thus it is possible to realize the electronic apparatus with high reliability.

Various electronic apparatuses are considered as the electronic apparatus 300, and examples of the electronic apparatuses include a personal computer (for example, mobile-type personal computer, laptop personal computer, or tablet personal computer), a mobile terminal such as a smartphone or a mobile phone, a digital still camera, an ink jet ejecting apparatus (for example, ink jet printer), a digital phase locked loop (PLL), a communication network device (for example, a storage area network device such as a router or a switch, or a local area network device), a device for a base station of a mobile terminal, a television, a video camera, a video tape recorder, a car navigation device, a real-time clock device, a a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, electronic thermometer, sphygmomanometer, blood glucose monitoring system, electrocardiogram measurement device, ultrasound diagnostic device, and electronic endoscope), a fish detector, various types of measuring apparatus, meters and gauges (for example, meters and gauges of a vehicle, an aircraft, and a vessel), a flight simulator, a head mounted display, a motion tracer, a motion tracker, a motion controller, PDR (walker position and direction measurement), and the like.

An example of the electronic apparatus 300 according to the present embodiment includes a transmission device functioning as a device for a base station of a terminal which performs communication with a terminal, for example, in a wired or wireless manner using the oscillator 310 mentioned above a reference signal source, a voltage variable oscillator (VCO), or the like. The electronic apparatus 300 according to the present embodiment can also be applied to a transmission device, desired to have high performance and high reliability, which is capable of being used in, for example, a communication base station by using, for example, the oscillator 1 of the above-described embodiment including the D/A conversion circuit 100 of each of the above-described embodiments as the oscillator 310.

4. Moving Object

Figure 16:
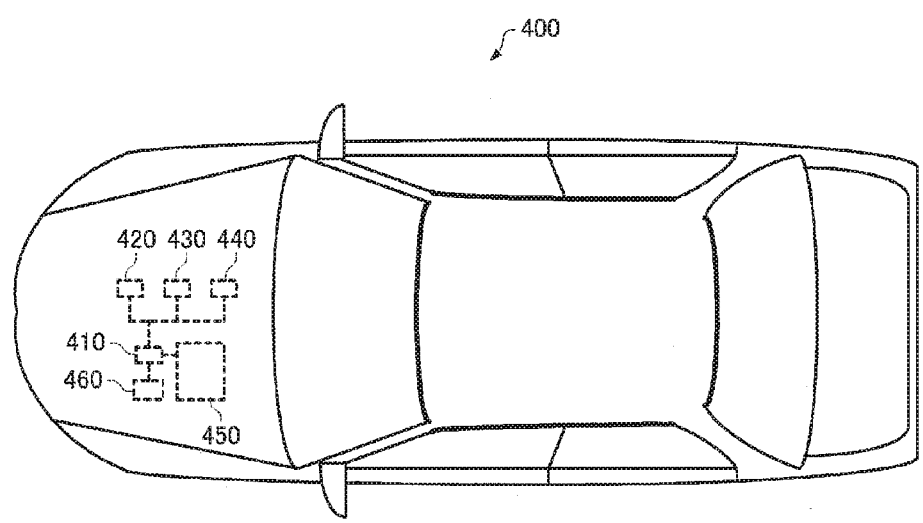
FIG. 16 is a diagram illustrating an example of a moving object according to the present embodiment.

FIG. 16 is a diagram (top view) illustrating an example of a moving object according to the present embodiment. A moving object 400 illustrated in FIG. 16 is configured to include an oscillator 410, controllers 420, 430, and 440 that perform a variety of control of an engine system, a brake system, a keyless entry system and the like, a battery 450, and a battery 460 for backup. Meanwhile, the moving object of the present embodiment may have a configuration in which some of the components (the respective portions) of FIG. 16 are omitted or changed, and may have a configuration in which other components are added.

The oscillator 410 has a resonator (not shown), an oscillation circuit (not shown) that resonates the resonator, and a D/A conversion circuit for controlling the oscillation circuit which are embedded therein, and outputs an oscillation signal by the resonation of the resonator. The oscillation signal is supplied to the controllers 420, 430, and 440 from the oscillator 410, and is used as, for example, a clock signal.

The battery 450 supplies power to the oscillator 410 and the controllers 420, 430, and 440. The battery 460 for backup supplies power to the oscillator 410 and the controllers 420, 430, and 440 when an output voltage of the battery 450 becomes lower than a threshold value.

For example, the D/A conversion circuit 100 of each of the above-described embodiments is used as the D/A conversion circuit built in the oscillator 410, and thus it is possible to realize the moving object with high reliability.

Various moving objects are considered as the moving object 400. Examples of the moving object include an automobile (also including an electric automobile), an aircraft such as a jet engine airplane or a helicopter, a vessel, a rocket, a satellite, and the like.

The invention is not limited to the present embodiment, and various changes and modifications can be made without departing from the scope of the invention.

Each of the above-described embodiments is an example, and is not limited thereto. For example, the embodiments can also be appropriately combined.

The invention includes configurations (for example, configurations having the same functions, methods and results, or configurations having the objects and effects) which are substantially the same as the configurations described in the above embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application Nos. 2015-007932, filed Jan. 19, 2015 and 2015-007935, filed Jan. 19, 2015 are expressly incorporated by reference herein.

What is claimed is:

1. A D/A conversion circuit comprising:
   a plurality of resistors that are connected to each other in series; and
   a plurality of MOS transistors that are connected to terminals of the plurality of resistors, respectively,
   wherein the plurality of resistors and the plurality of MOS transistors are formed on a semiconductor substrate,
   wherein the plurality of resistors are constituted by a resistive element and a plurality of contacts provided in the resistive element, and
   wherein the plurality of MOS transistors are disposed so that a plurality of virtual straight lines that pass through each of the plurality of contacts and are perpendicular to a longitudinal direction of the resistive element pass between gate electrodes of two adjacent MOS transistors, when seen in a plan view of the semiconductor substrate.

2. The D/A conversion circuit according to claim 1, wherein each of the plurality of resistors has a recess formed on a side facing the MOS transistor, when seen in a plan view of the semiconductor substrate.

3. The D/A conversion circuit according to claim 2, wherein each of the plurality of resistors has the recess formed along the gate electrode of the MOS transistor opposite thereto, when seen in a plan view of the semiconductor substrate.

4. The D/A conversion circuit according to claim 1, wherein the gate electrode of the MOS transistor is formed of polysilicon.

5. The D/A conversion circuit according to claim 1, wherein a distance between each of the plurality of resistors and the gate electrode of the MOS transistor is equal to or less than 1 μm.

6. The D/A conversion circuit according to claim 1,
   wherein the plurality of MOS transistors are constituted by a plurality of P-channel type MOS transistors and a plurality of N-channel type MOS transistors, and
   wherein, when seen in a plan view of the semiconductor substrate, each of the plurality of P-channel type MOS transistors is disposed so as to face one end parallel to the longitudinal direction of the resistive element, and
   wherein each of the plurality of N-channel type MOS transistors is disposed so as to face the other end parallel to the longitudinal direction of the resistive element.

7. The D/A conversion circuit according to claim 1,
   wherein, when seen in a plan view of the semiconductor substrate, the resistor that faces the MOS transistor has a recess formed on a side facing the MOS transistor, and
   wherein the resistor that does not face the MOS transistor faces a dummy electrode different from electrodes of the plurality of MOS transistors and has a recess formed on a side facing the dummy electrode.

8. An oscillator including the D/A conversion circuit according to claim 1.

9. An oscillator including the D/A conversion circuit according to claim 2.

10. An oscillator including the D/A conversion circuit according to claim 3.

11. An oscillator including the D/A conversion circuit according to claim 4.

12. An electronic apparatus including the D/A conversion circuit according to claim 1.

13. An electronic apparatus including the D/A conversion circuit according to claim 2.

14. An electronic apparatus including the D/A conversion circuit according to claim 3.

15. An electronic apparatus including the D/A conversion circuit according to claim 4.

16. A moving object including the D/A conversion circuit according to claim 1.

17. A moving object including the D/A conversion circuit according to claim 2.

18. A moving object including the D/A conversion circuit according to claim 3.

19. A moving object including the D/A conversion circuit according to claim 4.

* * * * *